US012727268B2

(12) United States Patent
Seo et al.

(10) Patent No.: US 12,727,268 B2
(45) Date of Patent: Sep. 1, 2026

(54) IMAGE SENSOR

(71) Applicant: Samsung Electronics Co., Ltd., Suwon-si (KR)

(72) Inventors: Jae-Kwan Seo, Suwon-si (KR); Youngchan Mo, Suwon-si (KR); Sori Park, Suwon-si (KR); Jinsu Park, Suwon-si (KR); Hyemi Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 369 days.

(21) Appl. No.: 18/379,426

(22) Filed: Oct. 12, 2023

(65) Prior Publication Data

US 2024/0282792 A1 Aug. 22, 2024

(30) Foreign Application Priority Data

Feb. 17, 2023 (KR) ........................ 10-2023-0021741

(51) Int. Cl.
*H10F 39/00* (2025.01)
*H04N 25/13* (2023.01)
(Continued)

(52) U.S. Cl.
CPC ....... *H10F 39/8053* (2025.01); *H04N 25/134* (2023.01); *H04N 25/703* (2023.01);
(Continued)

(58) Field of Classification Search
CPC .... H04N 25/134; H04N 25/703; H04N 25/70; H04N 25/7013; H04N 25/709; H04N 25/71; H04N 25/77; H04N 25/79; H04N 5/2253; H10F 39/024; H10F 39/182; H10F 39/80373; H10F 39/8053; H10F 39/8057; H10F 39/8063; H10F 39/807; H10F 39/809; H10F 39/811; H10F 39/199; H10F 39/8023; H10F 39/802; H10F 39/8037; H10F 39/014; H10F 39/12; H10F 39/151; H10F 39/153; H10F 39/18; H10F 39/8027; H10F 39/803; H10F 39/8033; H10F 39/806; H10F 39/812; H01L 23/3114; H01L 23/522; H01L 23/528;
(Continued)

(56) References Cited

U.S. PATENT DOCUMENTS 7,545,423 B2 6/2009 Park et al.
7,786,426 B2 8/2010 Yamashita et al.
8,698,265 B2 4/2014 Yoon
9,048,354 B2 6/2015 Park et al.
(Continued)

FOREIGN PATENT DOCUMENTS

JP 2022-32676 A 2/2022

*Primary Examiner* — Natalia A Gondarenko
(74) *Attorney, Agent, or Firm* — Sughrue Mion, PLLC

(57) ABSTRACT

An image sensor includes: a substrate including a pixel region and an optical black region, the optical black region including a dummy pixel region adjacent to the pixel region; a first color filter array on the pixel region; and a second color filter array on the dummy pixel region, wherein the substrate has a first surface, each of the first color filter array and the second color filter array is on the first surface of the substrate, and the second color filter array includes: a first filter that is transparent to a first ray; and a second filter that is transparent to a second ray.

19 Claims, 23 Drawing Sheets

(51) Int. Cl.
*H04N 25/703* (2023.01)
*H10F 39/18* (2025.01)

(52) U.S. Cl.
CPC ......... *H10F 39/024* (2025.01); *H10F 39/182* (2025.01); *H10F 39/80373* (2025.01); *H10F 39/8057* (2025.01); *H10F 39/8063* (2025.01); *H10F 39/807* (2025.01); *H10F 39/809* (2025.01); *H10F 39/811* (2025.01)

(58) Field of Classification Search
CPC ............. H01L 23/5283; H01L 23/5226; H01L 23/5329; H01L 23/5384; H01L 23/5386; H01L 23/345; H01L 23/481; H01L 24/04; H01L 24/05–09; H01L 24/10; H01L 24/12; H01L 24/14; H01L 24/16; H01L 27/14601; H01L 27/14636; H01L 27/14634; H01L 27/14643; H01L 27/14625; H01L 27/14607; H01L 27/14685; H01L 27/1469; G02F 1/0107; G02F 1/133; G02F 1/1333; G02F 1/133345; G02F 1/133354; G02F 1/13336; G02F 1/133512; G02F 1/133514; G02F 1/133519; G02F 1/133608; G02F 1/1339; G02F 1/136209; G02F 1/1368; G02F 1/136286
USPC ................ 257/432, 431, 448, 294, 774, 777
See application file for complete search history.

(56) References Cited

U.S. PATENT DOCUMENTS

| | | | | |
|---|---|---|---|---|
| 9,543,348 | B2 | 1/2017 | Park et al. | |
| 9,559,137 | B2 | 1/2017 | Chen et al. | |
| 10,170,511 | B1 | 1/2019 | Huang et al. | |
| 10,388,684 | B2 | 8/2019 | Kinsman et al. | |
| 10,672,811 | B2 | 6/2020 | Jung | |
| 11,031,425 | B2 | 6/2021 | Seo et al. | |
| 11,610,926 | B2 | 3/2023 | Yang et al. | |
| 11,652,124 | B2 | 5/2023 | Huang et al. | |
| 2007/0034916 | A1* | 2/2007 | Sang | H10F 39/182<br>257/292 |
| 2012/0012961 | A1 | 1/2012 | Kataoka et al. | |
| 2013/0100324 | A1 | 4/2013 | Ogino et al. | |
| 2015/0123227 | A1* | 5/2015 | Ootsuka | H10F 39/024<br>257/432 |
| 2015/0130005 | A1* | 5/2015 | Ko | H10F 39/8053<br>438/70 |
| 2018/0097028 | A1* | 4/2018 | Kinsman | H10F 39/8057 |
| 2021/0120199 | A1* | 4/2021 | Kim | H04N 25/766 |
| 2022/0020804 | A1 | 1/2022 | Kim et al. | |
| 2022/0037385 | A1* | 2/2022 | Bang | H10F 39/8057 |
| 2022/0059593 | A1* | 2/2022 | Seki | G02B 27/0018 |
| 2022/0149091 | A1 | 5/2022 | Joe et al. | |
| 2022/0213296 | A1* | 7/2022 | Kaneko | G03F 7/0007 |
| 2022/0293652 | A1* | 9/2022 | Chen | H10F 39/8053 |
| 2024/0072086 | A1* | 2/2024 | Lee | H10F 39/811 |
| 2024/0079426 | A1* | 3/2024 | Kwag | H10F 39/199 |
| 2024/0179419 | A1* | 5/2024 | Henley | A61B 1/043 |
| 2024/0363656 | A1* | 10/2024 | Masuda | H10F 39/804 |

* cited by examiner

100
I'
M
600
PX
PX
II'
I
II
PDR
OBR
APS
D1
D2
D3

FIG. 3B 920
922
912
902
471
400
932
1830
990
600
I'
PDR
D1
D2
D3

FIG. 4C 471
400
922
912
902
920
932
1830
990
600
I'
PDR
D1
D2
D3

IMAGE SENSOR

CROSS-REFERENCE TO RELATED APPLICATION

This application claims priority under 35 U.S.C § 119 to Korean Patent Application No. 10-2023-0021741 filed on Feb. 17, 2023 in the Korean Intellectual Property Office, the disclosure of which is incorporated by reference herein in its entirety.

BACKGROUND

The present disclosure relates to an image sensor, and more particularly, to an image sensor with improved sensitivity and performance.

An image sensor is a device to convert optical images into electrical signals. An image sensor can be classified into a charge coupled device (CCD) type and a complementary metal oxide semiconductor (CMOS) type. A CMOS type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

One or more example embodiments of the present disclosure provide an image sensor with improved performance for realizing images.

Further, one or more example embodiments of the present disclosure provide an image sensor with increased sensitivity.

According to an aspect of an example embodiment, an image sensor includes: a substrate including a pixel region and an optical black region, the optical black region including a dummy pixel region adjacent to the pixel region; a first color filter array on the pixel region; and a second color filter array on the dummy pixel region, wherein the substrate has a first surface, each of the first color filter array and the second color filter array is on the first surface of the substrate, and the second color filter array includes: a first filter that is transparent to a first ray; and a second filter that is transparent to a second ray.

According to an aspect of an example embodiment, an image sensor includes: a substrate including an optical black region; a color filter array on the optical black region; and a filtering layer on the color filter array, wherein the color filter array includes a Bayer pattern formed by a first sub-color filter, a second sub-color filter, and two third sub-color filters, and the Bayer pattern includes a link pattern interposed between the first sub-color filter and the second sub-color filter, the link pattern connecting the two third sub-color filters to each other.

According to an aspect of an example embodiment, an image sensor includes: a circuit chip; and an image sensor chip on the circuit chip, wherein the image sensor chip includes: a first substrate that has a first surface and a second surface that are opposite to each other, wherein the first substrate includes photoelectric conversion areas in the first surface and the second surface, the first substrate includes an pixel region and an optical black region, and the optical black region includes a dummy pixel region and a line connection region; a separation pattern that defines the photoelectric conversion areas in the first substrate; a dielectric layer that covers the first surface; a plurality of color filters on the dielectric layer, wherein the plurality of color filters include a first color filter on the pixel region, a second color filter on the dummy pixel region, and a third color filter on the line connection region; a protective layer between the dielectric layer and the plurality of color filters; a filtering layer on the second filter and the third filter; a plurality of microlenses on the plurality of color filters, wherein the plurality of microlenses include a first microlens corresponding to the first color filter, a second microlens corresponding to the second color filter, and a third microlens corresponding to the third color filter, respectively; a lens coating layer on the plurality of microlenses; a device isolation pattern adjacent to the second surface, the device isolation pattern defining an active area; a buried gate pattern on the second surface; and a first wiring layer on the buried gate pattern, wherein the circuit chip includes: a second substrate on which integrated circuits are provided; and a second wiring layer on the second surface, wherein the first wiring layer and the second wiring layer face each other and are electrically connected to each other, and wherein each of a width of the second color filter and a width of the third color filter is 1.5 times to 2.5 times greater than a width of the first color filter.

BRIEF DESCRIPTION OF DRAWINGS

FIGS. 3A and 3B illustrate cross-sectional views taken along line I-I' of FIG. 2:

FIGS. 4A to 4C illustrate cross-sectional views taken along line I-I' of FIG. 2, showing an image sensor according to one or more embodiments of the disclosure;

FIGS. 8A, 9A, 10A, and 11A illustrate plan views showing color filters of an image sensor:

FIGS. 8B, 9B, 10B, and 11B illustrate cross-sectional views taken along line A-A' of FIG. 6; and FIGS. 8C, 9C, 10C, and 11C illustrate cross-sectional views taken along line B-B' of FIG. 6.

DETAILED DESCRIPTION

Figure 1:
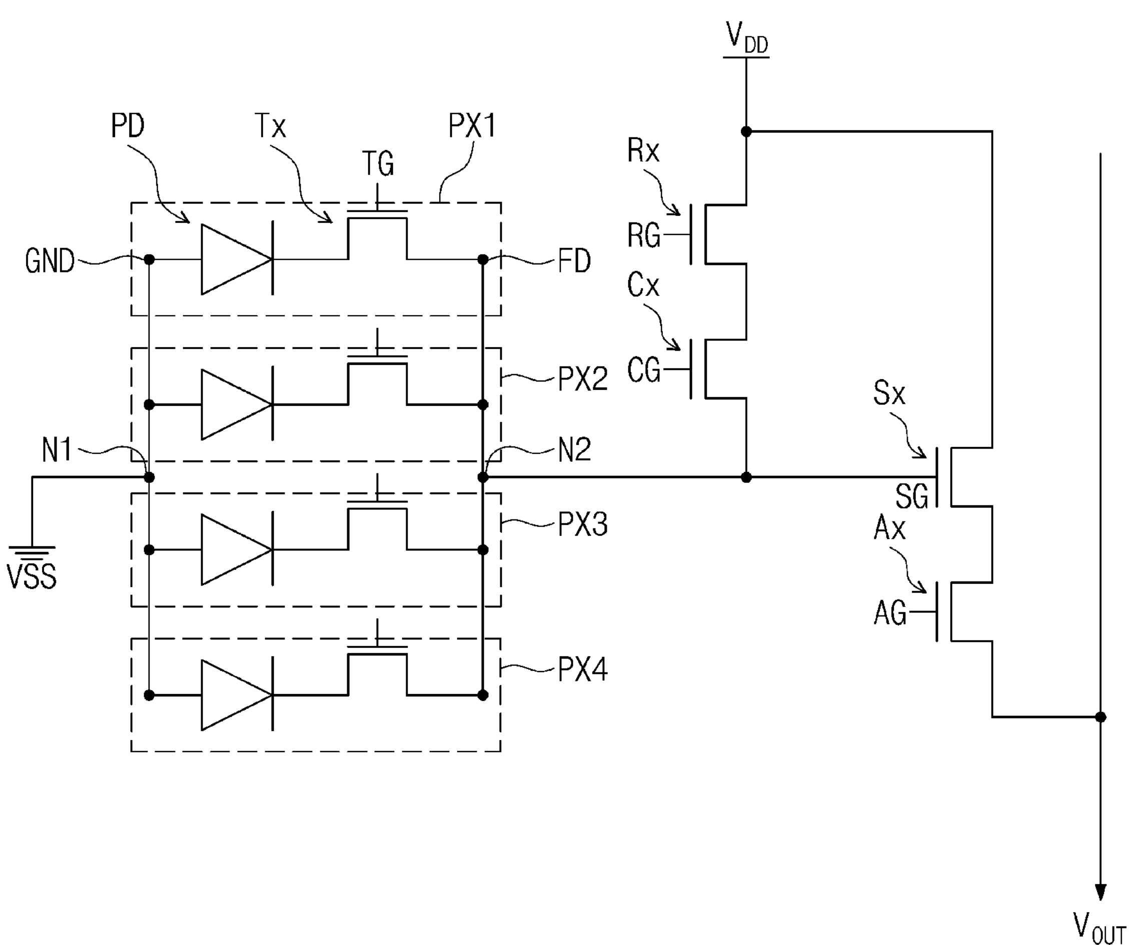
FIG. 1 illustrates a circuit diagram showing a pixel of an image sensor according to one or more embodiments of the disclosure.

FIG. 1 illustrates a circuit diagram showing a pixel of an image sensor according to one or more embodiments of the disclosure.

Referring to FIG. 1, an image sensor may include first to fourth pixels PX1 to PX4. Each of the first to fourth pixels PX1 to PX4 may include a ground area GND, a photoelectric conversion area PD, a transfer transistor Tx, and a floating diffusion area FD.

The ground area GND may include a p type impurity area. A ground voltage VSS may be applied in common through a first node N1 to the ground areas GND of the first to fourth pixels PX1 to PX4.

The photoelectric conversion area PD may be a photodiode that includes an n type impurity area and a p type impurity area. The floating diffusion area FD may include an n type impurity area. The floating diffusion area FD may serve as a drain of the transfer transistor Tx.

The floating diffusion areas FD of the first to fourth pixels PX1 to PX4 may be connected in common to a second node N2. The second node N2 to which are connected the floating diffusion areas FD of the first to fourth pixels PX1 to PX4 may be connected to a source of a conversion gain transistor Cx. The conversion gain transistor Cx may be connected to a reset transistor Rx.

The second node N2 may also be electrically connected to a source follower gate SG of a source follower transistor Sx. The source follower transistor Sx may be connected to a selection transistor Ax.

An operation of the image sensor will be explained below with reference to FIG. 1. First, a power voltage Vpp may be applied to a drain of the reset transistor Rx and a drain of the source follower transistor Sx under a light-blocked state, such that the reset transistor Rx may be turned on to discharge charges that remain on the floating diffusion area FD. Thereafter, when the reset transistor Rx is turned off and external light is incident on the photoelectric conversion area PD, electron-hole pairs may be generated from the photoelectric conversion area PD. Holes may be transferred to and accumulated on a p type impurity area of the photoelectric conversion area PD, and electrons may be transferred to and accumulated on an n type impurity area of the photoelectric conversion area PD. When the transfer transistor Tx is turned on, charges such as electrons and holes may be transferred to and accumulated on the floating diffusion area FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

A wiring line may be electrically connected to at least one selected from a transfer gate TG, a source follower gate SG, a reset gate RG, and a selection gate AG. The wiring line may be configured to apply the power voltage VDD to the drain of the reset transistor Rx or the drain of the source follower transistor Sx. The wiring line may include a column line connected to the selection transistor Ax. The wiring line may include a first conductive structure 830 which will be discussed in FIGS. 3A and 3B.

FIG. 1 depicts by way of example the first to fourth pixels PX1 to PX4 that share the first node N1 and the second node N2, but embodiments are not limited thereto.

Figure 2:
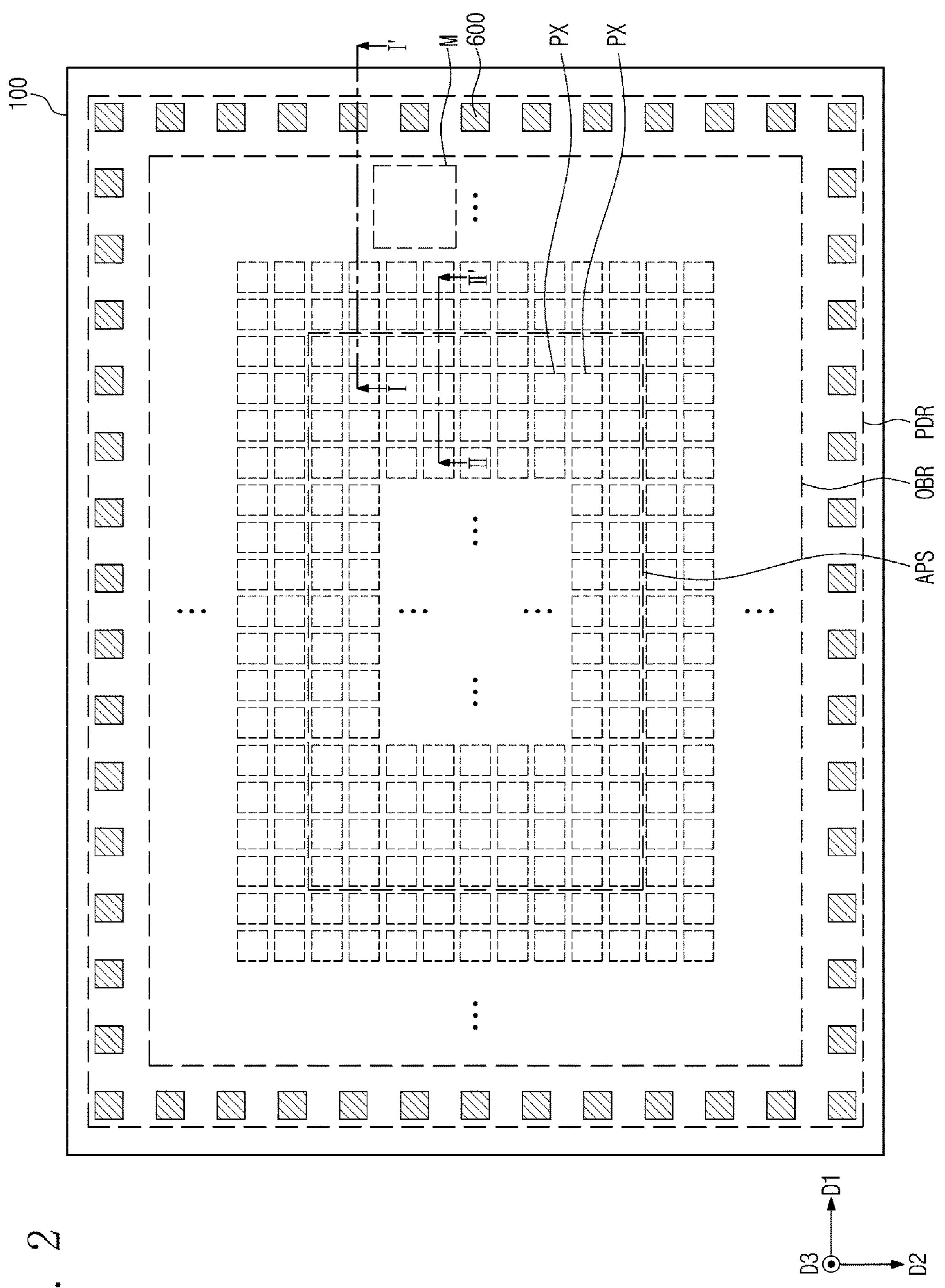
FIG. 2 illustrates a plan view showing an image sensor according to one or more embodiments of the disclosure.
Figure 3A:
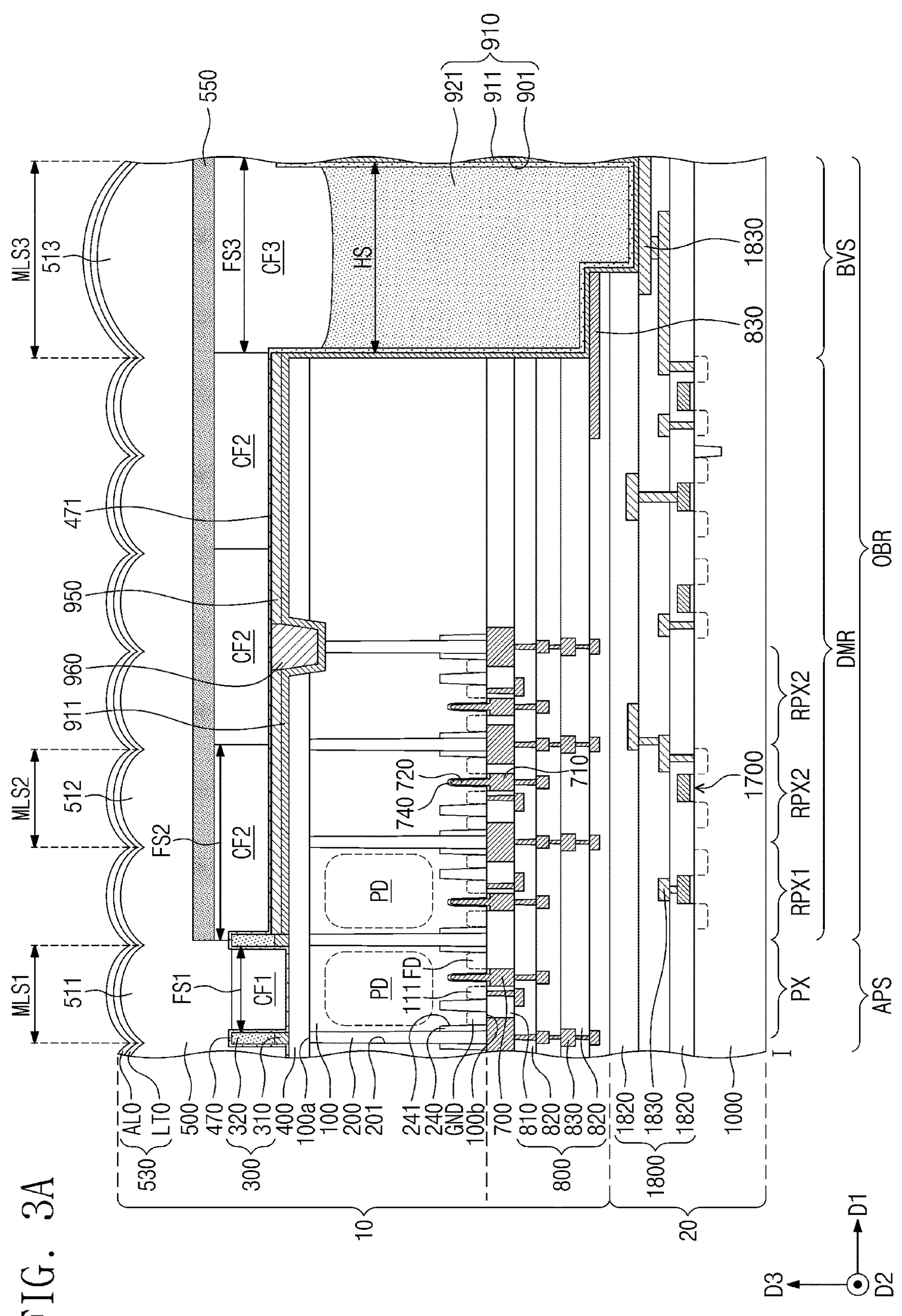
Figure 3B:
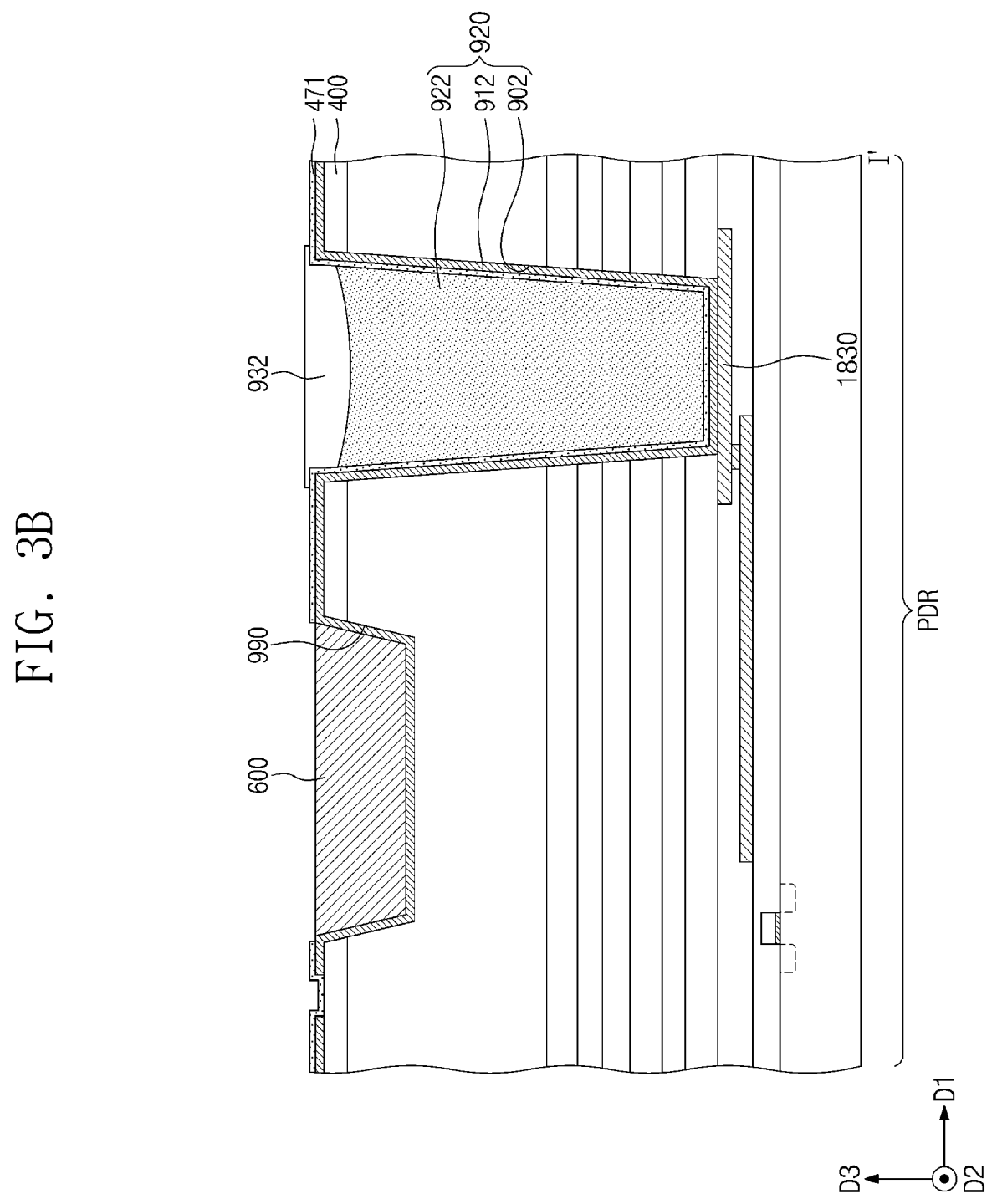

FIG. 2 illustrates a plan view showing an image sensor according to one or more embodiments of the disclosure. FIGS. 3A and 3B illustrate cross-sectional views taken along line I-I' of FIG. 2.

Referring to FIGS. 2, 3A, and 3B, an image sensor may include a sensor chip 10. The sensor chip 10 may include a first substrate 100, a first wiring layer 800, a dielectric layer 400, a protective layer 470, a first color filter array, a second color filter array, a fence pattern 300, and a microlens layer 500.

When viewed in plan, the first substrate 100 may include a pixel array region APS, an optical black region OBR, and a pad region PDR. The pixel array region APS may be disposed on a central portion of the first substrate 100. The pixel array region APS may include a plurality of pixel regions PX. The pixel discussed with reference to FIG. 1 may be provided to each of pixel regions PX of the first substrate 100. For example, components of the pixel depicted in FIG. 1 may be provided to each of the pixel regions PX. The pixel regions PX may output photoelectric signals from incident light.

The pixel regions PX may be two-dimensionally arranged in rows and columns. The rows may be parallel to a first direction D1. The columns may be parallel to a second direction D2. In this description, the first direction D1 may be parallel to a first surface 100*a* of the first substrate 100. The second direction D2 may be parallel to the first surface 100*a* of the first substrate 100 and may intersect the first direction D1. For example, the second direction D2 may be substantially orthogonal to the first direction D1. A third direction D3 may be perpendicular to the first and second directions D1 and D2. For example, the third direction D3 may be substantially perpendicular to the first surface 100*a* of the first substrate 100.

The pad region PDR may surround the pixel array region APS, while being provided on an edge portion of the first substrate 100. The pad region PDR may be provided with pads PAD thereon. The pads PAD may externally output electrical signals generated from the pixel regions PX. Alternatively, external electrical signals or voltages may be transferred through the pads PAD to the pixel regions PX. As the pad region PDR is disposed on the edge portion of the first substrate 100, the pads PAD may be easily coupled to an external apparatus. The optical black region OBR will be described below. The following description will focus on the pixel array region APS of the sensor chip 10 included in the image sensor.

The first substrate 100 may have a first surface 100*a* and a second surface 100*b* that are opposite to each other. The first surface 100*a* may be a rear surface of the first substrate 100, and the second surface 100*b* may be a front surface of the first substrate 100. The first substrate 100 may receive light on the first surface 100*a*. The first substrate 100 may be a semiconductor substrate or a silicon-on-insulator (SOI) substrate. The semiconductor substrate may be, for example, a silicon substrate, a germanium substrate, or a silicon-germanium substrate. The first substrate 100 may further include a III-group element. The III-group element may be an impurity having a first conductivity type. For example, the first substrate 100 may have the first conductivity type, for example, p type. For example, impurities having the first conductivity type may include one or more of aluminum (Al), boron (B), indium (In), and gallium (Ga).

The first substrate 100 may include a plurality of photoelectric conversion areas PD therein. The photoelectric conversion areas PD may be positioned between the first surface 100*a* and the second surface 100*b* of the first substrate 100. The photoelectric conversion areas PD may be correspondingly disposed in the pixel regions PX of the first substrate 100. The photoelectric conversion area PD of FIG. 3A may be the same as the photoelectric conversion area PD of FIG. 1.

The photoelectric conversion area PD may further include a V-group element. The V-group element may be an impurity having a second conductivity type. For example, the photoelectric conversion area PD may be an impurity area having the second conductivity type. The second conductivity type may be an n type different from the first conductivity type. The impurities having the second conductivity type may include one or more of phosphorus, arsenic, bismuth, and antimony. The photoelectric conversion area PD may be adjacent to the first surface 100*a* of the first substrate 100. The photoelectric conversion area PD may extend from the first surface 100*a* toward the second surface 100*b*.

The first substrate 100 may be provided therein with a separation pattern 200 that defines the pixel regions PX. For example, the separation pattern 200 may be provided between neighboring pixel regions PX. The separation pattern 200 may be a pixel isolation pattern. The separation pattern 200 may be provided in a first trench 201. The first trench 201 may be recessed from the second surface 100*b* toward the first surface 100*a* of the first substrate 100.

The separation pattern 200 may be a deep trench isolation (DTI) layer. According to the present embodiment, the separation pattern 200 may penetrate the first substrate 100. In an embodiment, the separation pattern 200 may not penetrate the first substrate 100 and may be spaced apart from the first surface 100*a* of the first substrate 100. A width of the separation pattern 200 adjacent to the second surface 100*b* may be greater than that of the separation pattern 200 adjacent to the first surface 100*a*.

The first color filter array may be disposed on a plurality of pixel regions PX on the first surface 100*a* of the first substrate 100. The first color filter array may include a plurality of first color filters CF1. For example, the first color filters CF1 may be provided on corresponding locations that correspond to those of the photoelectric conversion areas PD. In an embodiment, each of the first color filters CF1 may include one of a red filter, a blue filter, and a green filter. In an embodiment, the first color filter CF1 may further include a white filter.

In an embodiment, the first color filter array may include a Bayer pattern when viewed in plan. In an embodiment, the first color filter array may include a Quad Bayer pattern when viewed in plan. The Quad Bayer pattern may be defined to indicate a pattern in which unit color filters having the same color filters are arranged in a two-by-two (2×2) arrangement. For example, the Bayer pattern may be a pattern in which the first color filters CF1 that are red filters, blue filters, or green filters are arranged while two-dimensionally crossing each other.

The fence pattern 300 may be disposed on the separation pattern 200. For example, the fence pattern 300 may vertically overlap the separation pattern 200. The fence pattern 300 may be disposed on opposite sides of the first color filter CF1. The fence pattern 300 may be interposed between and separate two first color filters CF1 that are adjacent to each other. For example, the fence pattern 300 may physically and optically separate the first color filters CF1 from each other. In such a case, the fence pattern 300 may divide the first color filter CF1.

The fence pattern 300 may have a planar shape that corresponds to that of the separation pattern 200. For example, the fence pattern 300 may have a grid shape. When viewed in plan, the fence pattern 300 may surround each of the pixel regions PX. The fence pattern 300 may surround each of the first color filters CF1. The fence pattern 300 may include first segments and second segments. The first segments may extend parallel to the first direction D1 and may be spaced apart from each other in the second direction D2. The second segments may extend parallel to the second direction D2 and may be spaced apart from each other in the first direction D1. The second segments may intersect the first segments.

The fence pattern 300 may include a first fence pattern 310 and a second fence pattern 320. The first fence pattern 310 may be disposed between the dielectric layer 400 and the second fence pattern 320. The first fence pattern 310 may include a conductive material, such as one or more of metal and metal nitride. For example, the first fence pattern 310 may include one or more of titanium and titanium nitride.

The second fence pattern 320 may be disposed on the first fence pattern 310. The second fence pattern 320 may include a different material from that of the first fence pattern 310. The second fence pattern 320 may include an organic material. The second fence pattern 320 may include a material whose refractive index is low and may have dielectric properties.

On the pixel region PX, the first color filter CF1 may vertically overlap N numbers of the separation patterns 200. For example, the first color filter CF1 may vertically overlap two separation patterns 200 below the fence pattern 300. The N may be a positive integer.

The dielectric layer 400 may be interposed between the first substrate 100 and the first color filters CF1 and between the separation pattern 200 and the fence pattern 300. The dielectric layer 400 may cover the first surface 100*a* of the first substrate 100 and a top surface of the separation pattern 200. The dielectric layer 400 may be a backside dielectric layer. The dielectric layer 400 may include a bottom anti-reflective coating (BARC) layer. The dielectric layer 400 may include a plurality of layers, which layers may have different functions from each other.

In an embodiment, the dielectric layer 400 may include a first dielectric layer, a second dielectric layer, a third dielectric layer, a fourth dielectric layer, and a fifth dielectric layer that are sequentially stacked on the first surface 100*a* of the first substrate 100. The first dielectric layer may cover the first surface 100*a* of the first substrate 100. The first and second dielectric layers may be fixed charge layers. Each of the fixed charge layers may be formed of a metal oxide layer or a metal fluoride layer. The metal oxide layer may include oxygen whose amount is less than a stoichiometric ratio, and the metal fluoride layer may include fluorine whose amount is less than a stoichiometric ratio.

For example, the first dielectric layer may include metal oxide or metal fluoride that includes at least one metal selected from hafnium (Hf), zirconium (Zr), aluminum (Al), tantalum (Ta), titanium (Ti), yttrium (Y), and lanthanide. The second dielectric layer may include one of metal oxide and metal fluoride that are discussed in the example of the first dielectric layer. However, the second dielectric layer may include a different material from that of the first dielectric layer. For example, the first dielectric layer may include aluminum oxide, and the second dielectric layer may include hafnium oxide.

Each of the first and second dielectric layers may have a negative fixed charge and may produce hole accumulation. The first and second dielectric layers may effectively reduce white spot and dark current of the first substrate 100. The second dielectric layer may have a thickness greater than that of the first dielectric layer.

The third dielectric layer may be disposed on the second dielectric layer. The third dielectric layer may include a first silicon-containing material. The first silicon-containing material may include, for example, tetraethylorthosilicate (TEOS) or silicon oxide. The third dielectric layer may have good filling properties. The third dielectric layer may be formed by plasma enhanced chemical vapor deposition, but the embodiments are not limited thereto. The third dielectric layer may have a thickness greater than that of the first dielectric layer and that of the second dielectric layer.

The fourth dielectric layer may be disposed on the third dielectric layer. The fourth dielectric layer may include a different material from that of the third dielectric layer. The fourth dielectric layer may include a second silicon-containing material, and the second silicon-containing material may be different from the first silicon-containing material. For example, the fourth dielectric layer may include silicon nitride. The fourth dielectric layer may have a thickness greater than that of the third dielectric layer.

The fifth dielectric layer may be disposed between the fourth dielectric layer and the first fence pattern 310 and between the fourth dielectric layer and the color filters CF. The fifth dielectric layer may be in physical contact with a bottom surface of the first fence pattern 310. The fifth dielectric layer may be an adhesive layer or a capping layer. The fifth dielectric layer may include a high-k dielectric material or metal oxide. The fifth dielectric layer may include the same material as that of the second dielectric layer. For example, the fifth dielectric layer may include hafnium oxide. The fifth dielectric layer may have a thickness greater than that of each of the first and second dielectric layers and less than that of each of the third and fourth dielectric layers.

Differently from the embodiment discussed in detail above, the number of layers included in the dielectric layer 400 may be variously changed. For example, at least one of the first to fifth dielectric layers may be omitted.

The protective layer 470 may cover the dielectric layer 400 and the fence pattern 300. The protective layer 470 may include a high-k dielectric material and may have dielectric properties. For example, the protective layer 470 may include aluminum oxide or hafnium oxide. The protective layer 470 may include aluminum oxide, but embodiments are not limited thereto. The protective layer 470 may protect the photoelectric conversion area PD of the first substrate 100 against external environment such as moisture.

The first color filter CF1 may be provided on the protective layer 470. When viewed in plan, the fence pattern 300 may separate the first color filters CF1 from each other. An uppermost surface of the first color filter CF1 may be higher than a top surface of the fence pattern 300.

The microlens layer 500 may be provided on the first surface 100*a* of the first substrate 100. For example, the microlens layer 500 may be provided on the first color filter CF1. The protective layer 470 may be interposed between the second fence pattern 320 and the microlens layer 500.

The microlens layer 500 may include a first microlens 511 that is convex. The first microlens 511 may be provided on positions that correspond to the photoelectric conversion areas FD of the first substrate 100. For example, the first microlens 511 may be provided on and correspond to the first color filter CF1. When viewed in plan, the first microlens 511 may form an array arranged in the first direction D1 and the second direction D2. The first microlenses 511 may protrude away from the first surface 100*a* of the first substrate 100. The first microlens 511 may have a hemispherical cross-section. The first microlens 511 may concentrate incident light.

The microlens layer 500 may be transparent to light. The microlens layer 500 may include an organic material, such as a polymer. For example, the microlens layer 500 may include a photoresist material or a thermosetting resin.

A lens coating layer 530 may be provided on the microlens layer 500. The lens coating layer 530 may be transparent. The lens coating layer 530 may conformally cover a top surface of the microlens layer 500. The lens coating layer 530 may protect the microlens layer 500.

The first substrate 100 may include a ground area GND, a floating diffusion area FD, and an impurity area 111 that are adjacent to the second surface 100*b* of the first substrate 100. The ground area GND, the floating diffusion area FD, and the impurity area 111 may be disposed in each of the pixel regions PX. The ground area GND, the floating diffusion area FD, and the impurity area 111 may have their bottom surfaces each of which is perpendicularly spaced apart from the photoelectric conversion area PD.

The ground area GND may be heavily doped with impurities to have a first conductivity type (e.g., p+ type). The floating diffusion area FD and the impurity area 111 may each be doped with impurities to have a second conductivity type (e.g., n type).

The impurity area 111 may be an active area for operation of a transistor. The impurity area 111 may include a source/drain area of at least one selected from the conversion gain transistor Cx, the reset transistor Rx, the source/follower transistor Sx, and the selection transistor Ax that are discussed with reference to FIG. 1.

A device isolation pattern 240 may be provided which is adjacent to the second surface 100*b* of the first substrate 100. The device isolation pattern 240 may define an active area in the pixel region PX. For example, in the pixel region PX, the device isolation pattern 240 may define the ground area GND, the floating diffusion area FD, and the impurity area 111.

The device isolation pattern 240 may be provided in a second trench 241, and the second trench 241 may be recessed from the second surface 100*b* of the first substrate 100. The device isolation pattern 240 may be a shallow trench isolation (STI) layer. The device isolation pattern 240 may have a depth less than that of the separation pattern 200. A portion of the device isolation pattern 240 may be connected to a sidewall of the separation pattern 200. The device isolation pattern 240 may include, for example, one or more of silicon oxide, silicon nitride, and silicon oxynitride.

A buried gate pattern 700 may be provided on the second surface 100*b* of the first substrate 100. The buried gate pattern 700 may include the transfer gate TG of the transfer transistor Tx discussed above in FIG. 1. At least one additional gate pattern may be provided on each of the pixel regions PX.

The additional gate pattern may serve as a gate electrode of at least one selected from the conversion gain transistor Cx, the source follower transistor Sx, the reset transistor Rx, and the selection transistor Ax that are discussed above in FIG. 1. For example, the additional gate pattern may include one of the conversion gain gate CG, the source follower gate SG, the reset gate RG, and the selection gate AG.

The buried gate pattern 700 may have a buried type gate structure. For example, the buried gate pattern 700 may include a first part 710 and a second part 720. The first part 710 of the buried gate pattern 700 may be disposed on the second surface 100*b* of the first substrate 100. The second part 720 of the buried gate pattern 700 may be buried in the first substrate 100. The second part 720 of the buried gate pattern 700 may be connected to the first part 710 of the buried gate pattern 700. Differently from that shown, the buried gate pattern 700 may have a planar gate structure. In this case, the buried gate pattern 700 may not include the second part 720. The buried gate pattern 700 may include metal, metal silicide, polysilicon, or any combination thereof. The polysilicon may include doped polysilicon.

A gate dielectric pattern 740 may be interposed between the buried gate pattern 700 and the first substrate 100. The gate dielectric pattern 740 may include, for example, one or more of silicon-based dielectric materials (e.g., silicon oxide, silicon nitride, and/or silicon oxynitride) and high-k dielectric materials (e.g., hafnium oxide and/or aluminum oxide.

A first pad may be provided on the ground area GND. The first pad may be provided on and electrically connect to each other the ground areas GND of neighboring pixel regions PX. The first pad may include the first node N1 discussed in FIG. 1.

A second pad may be provided on the floating diffusion area FD. The second pad may be provided on and electrically connect to each other the ground areas GND of neighboring pixel regions PX. The second pad may include the second node N2 discussed in FIG. 1.

The first and second pads may include metal, metal silicide, polysilicon, or any combination thereof. For example, the first and second pads may include doped polysilicon.

The first wiring layer 800 may be disposed on the second surface 100*b* of the first substrate 100. The first wiring layer 800 may include a first interlayer dielectric layer 810, second interlayer dielectric layers 820, and a first conductive structure 830. The first interlayer dielectric layer 810 may cover the buried gate pattern 700 and the second surface 100*b* of the first substrate 100. The second interlayer dielectric layers 820 may be stacked on the first interlayer dielectric layer 810. The first and second interlayer dielectric layers 810 and 820 may include a silicon-based dielectric material, for example, one or more of silicon oxide, silicon nitride, and silicon oxynitride.

The first conductive structure 830 may be provided in the first and second interlayer dielectric layers 810 and 820. The first conductive structure 830 may include contacts, wiring lines, and vias. The contact may be provided in the first interlayer dielectric layer 810 and may be connected to at least one selected from the buried gate pattern 700, the first and second pads, and the impurity areas 111. The wiring line of the first conductive structure 830 may be connected to the contact of the first conductive structure 830. The via of the first conductive structure 830 may penetrate at least one of the second interlayer dielectric layers 820 and may connect to each other the wiring lines that are vertically adjacent to each other. The first conductive structure 830 may receive photoelectric signals that are output from the photoelectric conversion areas PD.

The following will describe the circuit chip 20 of the image sensor and will also describe the optical black region OBR and the pad region PDR of the first substrate 100. Referring back to FIGS. 2, 3A, and 3B, the optical black region OBR of the first substrate 100 may be interposed between the pixel array region APS and the pad region PDR. The optical black region OBR may include a dummy pixel region DMR and a line connection region BVS. The dummy pixel region DMR may be adjacent to the pixel array region APS. The line connection region BVS may be interposed between the dummy pixel region DMR and the pad region PDR.

The dummy pixel region DMR may include a first reference pixel region RPX1 and a second reference pixel region RPX2. The first reference pixel region RPX1 may be disposed between the second reference pixel region RPX2 and the pixel array region APS. On the dummy pixel region DMR, the photoelectric conversion area PD may be provided in the first reference pixel region RPX1. The photoelectric conversion area PD on the first reference pixel region RPX1 may have a planar area and a volume the same as those of each of the photoelectric conversion areas PD on the pixel regions PX. The photoelectric conversion area PD may not be provided in the second reference pixel region RPX2. The impurity areas 111, the buried gate pattern 700, and the device isolation pattern 240 may be disposed on each of the first and second reference pixel regions RPX1 and RPX2.

The dielectric layer 400 may extend from the pixel array region APS through the optical black region OBR onto the pad region PDR. A light-shield layer 950 may be provided on the dummy pixel region DMR. The light-shield layer 950 may be disposed on a top surface of the dielectric layer 400. The light-shield layer 950 may prevent light from entering the photoelectric conversion area PD on the optical black region OBR. On the optical black region OBR, pixels of the first and second reference pixel regions RPX1 and RPX2 may output noise signals without outputting photoelectric signals. The noise signals may be generated from electrons produced due to heat or dark current. The light-shield layer 950 may not cover the pixel array region APS, and thus light may be incident on the photoelectric conversion areas PD on the pixel array region APS. The noise signals may be removed from photoelectric signals that are output from the pixel regions PX. The light-shield layer 950 may include metal, such as tungsten, copper, aluminum, or any alloy thereof.

On the dummy pixel region DMR of the first substrate 100, a first conductive pattern 911 may be disposed between the dielectric layer 400 and the light-shield layer 950. For example, the first conductive pattern 911 may extend from the dummy pixel region DMR through the line connection region BVS onto the pad region PDR. The first conductive pattern 911 may serve as a barrier layer or an adhesive layer. The first conductive pattern 911 may include one or more of metal and metal nitride. For example, the first conductive pattern 911 may include metal, such copper, tungsten, aluminum, titanium, tantalum, or any alloy thereof. The first conductive pattern 911 may not extend onto the pixel array region APS of the first substrate 100.

On the optical black region OBR of the first substrate 100, a contact plug 960 may be provided on the first surface 100*a* of the first substrate 100. The contact plug 960 may be disposed on an outermost separation pattern 200 in the optical black region OBR. The first substrate 100 may be provided on its first surface 100*a* with a contact trench that penetrates the dielectric layer 400, and the contact plug 960 may be provided in the contact trench.

The contact plug 960 may include a different material from that of the light-shield layer 950. For example, the contact plug 960 may include a metallic material, such as aluminum. The first conductive pattern 911 may extend between the contact plug 960 and the dielectric layer 400 and between the contact plug 960 and the separation pattern 200.

A protective dielectric layer 471 may be provided on the optical black region OBR. The protective dielectric layer 471 may be disposed on a top surface of the light-shield layer 950 and a top surface of the contact plug 960. The protective dielectric layer 471 may include the same material as that of the protective layer 470 and may be connected to the protective layer 470. The protective dielectric layer 471 and the protective layer 470 may be integrally formed into a single unitary body. Alternatively, the protective dielectric layer 471 may be formed by a process separate from that used for forming the protective layer 470, and may be spaced apart from the protective layer 470. The protective dielectric layer 471 may include a high-k dielectric material (e.g., aluminum oxide and/or hafnium oxide).

The second color filter array may be disposed on the dummy pixel region DMR on the first surface 100*a* of the first substrate 100. For example, the second color filter array may be disposed on the protective dielectric layer 471 on the dummy pixel region DMR. The second color filter array may include a plurality of second color filters CF2. In an embodiment, each of the second color filters CF2 may include one of a red filter, a blue filter, and a green filter. In an embodiment, the second color filter CF2 may further include a white filter.

Each of the second color filters CF2 may be a first filter transparent to a first ray, a second filter transparent to a second ray, or a third filter transparent to a third ray. For example, the first filter may be a green filter, the second filter may be a blue filter, and the third filter may be a red filter. The first to third rays may be visible rays having wavelengths of about 400 nm to about 700 nm. The first to third rays may be visible rays having different wavelengths from each other. The first to third rays may be respectively incident on the first to third filters through the microlens layer 500 which will be discussed below.

In an embodiment, when viewed in plan, the second color filter array may include a Bayer pattern. In an embodiment, when viewed in plan, the second color filter array may include a Quad Bayer pattern. The first and second color filter arrays may include the same Bayer or Quad Bayer pattern. Alternatively, the first and second color filter arrays may include different patterns from each other. For example, the first color filter array may be a Bayer pattern (or Quad Bayer pattern), and the second color filter array may be a Quad Bayer pattern (or Bayer pattern).

The fence pattern 300 may not be disposed between neighboring second color filters CF2. The second color filter CF2 on the first reference pixel region RPX1 may have one lateral surface adjacent to the fence pattern 300 and another lateral surface adjacent to another second color filter CF2.

The second color filter CF2 may vertically overlap M numbers of the separation patterns 200 on the dummy pixel region DMR of the optical black region OBR. The second color filter CF2 may be one of the first to third filters discussed above. For example, the second color filter CF2 adjacent to the first color filter CF1 may vertically overlap three separation patterns 200. The M may be a positive integer. The M may be a positive integer the same as or greater than the N. For example, the M may be a positive integer equal to N+1 or N+2.

A first through structure 910 may be disposed adjacent to a first side of an external bonding pad 600 which will be discussed below. The first through structure 910 may be provided on the line connection region BVS. The first through structure 910 may include a first through hole 901, the first conductive pattern 911 that extends from the dummy pixel region DMR, and a first buried pattern 921 on the first conductive pattern 911.

The first through hole 901 may be provided between the external bonding pad 600 and the contact plug 960. The first through hole 901 may penetrate the dielectric layer 400, the first substrate 100, and the first wiring layer 800. The first through hole 901 may further penetrate at least a portion of a second wiring layer 1800 which will be discussed below. The first through hole 901 may have a first bottom surface and a second bottom surface. The first bottom surface of the first through hole 901 may expose the first conductive structure 830. The second bottom surface of the first through hole 901 may be located at a lower level than that of the first bottom surface of the first through hole 901. The second bottom surface of the first through hole 901 may expose a second conductive structure 1830 which will be discussed below.

The first conductive pattern 911 may extend from the dummy pixel region DMR through the line connection region BVS onto the pad region PDR. The first conductive pattern 911 may cover an inner wall of the first through hole 901. The first conductive pattern 911 in the first through hole 901 may be in contact with a top surface of the first conductive structure 830.

The first conductive pattern 911 in the first through hole 901 may also be in contact with a top surface of the second conductive structure 1830. The second conductive structure 1830 may be electrically connected through the first conductive pattern 911 to the first conductive structure 830.

The first buried pattern 921 may be provided in the first through hole 901, thereby filling the first through hole 901. The first buried pattern 921 may include a low-refractive material and may have dielectric properties. The first buried pattern 921 may include the same material as that of the first fence pattern 310. The first buried pattern 921 may have a recess on a top surface thereof. For example, the top surface of the first buried pattern 921 may have a center lower than an edge of the top surface of the first buried pattern 921.

A third color filter CF3 may be disposed on the line connection region BVS on the first surface 100*a* of the first substrate 100. For example, the third color filter CF3 may be disposed on the top surface of the first buried pattern 921. The third color filter CF3 may fill the recess of the first buried pattern 921. A top surface of the third color filter CF3 may be substantially flat. In an embodiment, the third color filter CF3 may include one of a red filter, a blue filter, and a green filter.

In an embodiment, the second color filters CF2 and the third color filter CF3 may constitute a color filter array when viewed in plan. For example, when viewed in plan, the second and third color filters CF2 and CF3 may be two-dimensionally arranged in a Bayer pattern fashion. The second and third color filters CF2 and CF3 may have their uppermost top surfaces higher than a top surface of the first color filter CF1.

As a plurality of color filters are disposed from the pixel array region APS to the optical black region OBR, it may be possible to prevent coating striation on the pixel array region APS. The coating striation may be a stripped image that occurs at an interface between hydrophilic and hydrophobic elements. In addition, the coating striation may occur when, after a photoresist composition is coated, a solvent is irregularly evaporated from the composition.

According to one or more embodiments of the disclosure, as a plurality of color filters are disposed even on the optical black region OBR, the coating striation may occur on the dummy pixel region DMR of the optical black region OBR, and relatively may not occur on the pixel array region APS. This may be caused by the fact that each of color filters on the optical black region OBR has a size greater than that of a color filter on the pixel array region APS. For example, there may be a large interface between hydrophilic and hydrophobic properties on the optical black region OBR, and therefore the coating striation may occur not on the pixel array region APS but on the optical black region OBR. Accordingly, one or more embodiments of may allow the image sensor to have improved sensitivity and performance.

A filtering layer 550 may be disposed on the optical black region OBR. For example, the filtering layer 550 may further be disposed on the second color filters CF2 on the dummy pixel region DMR and the third color filter CF3 on the line connection region BVS. The filtering layer 550 may cover a top surface of each of the second and third color filters CF2 and CF3. The filtering layer 550 may block light whose wavelength is different from that of light produced from the color filters CF. For example, the filtering layer 550 may block an infrared ray. The filtering layer 550 may include a blue color filter, but embodiments of the present disclosure are not limited thereto.

The filtering layer 550 may include a photoresist material whose transmittance is in a range of about 1% to about 5% with respect to a wavelength ranging from about 300 nm to about 1,200 nm. For example, the filtering layer 550 may include a black photoresist material whose transmittance is about 1% to about 2% with respect to a wavelength ranging from about 400 nm to about 700 nm.

A plurality of color filters may be disposed in a Bayer pattern on the optical black region OBR, and thus a flare phenomenon may occur in a module in the image sensor. The flare phenomenon may refer to light glare that occurs when light incident through a lens is reflected or scattered in an image sensor. In addition, the flare phenomenon may denote an event in which a strong light source is internally reflected and blurred in an image sensor.

According to one or more embodiments of the disclosure, the filtering layer 550 may be disposed on a plurality of color filters on the optical black region OBR, and thus the flare phenomenon may be avoided. This may be caused by the fact that, because the filtering layer 550 has an optical transmittance of about 1% to about 5%, the filtering layer 550 block light incident through the microlenses 512 and 513 which will be discussed below. For example, when the filtering layer 550 includes a black photoresist material whose transmittance is in a range of about 1% to about 5%, the flare phenomenon may be alleviated because the filtering layer 550 has a light blocking ratio greater than that of a blue bulk formed on color filters. Accordingly, embodiments of the present disclosure may allow the image sensor to have improved sensitivity and performance.

The microlens layer 500 may be provided on the first surface 100*a* of the first substrate 100. For example, the microlens layer 500 may be provided on the first color filter CF1 and the filtering layer 550. The microlens layer 500 may cover a top surface of the first color filter CF1 and top and one lateral surfaces of the filtering layer 550. The microlens layer 500 may extend from the pixel array region APS onto the line connection region BVS of the optical black region OBR.

The microlens layer 500 may further include a convex second microlens 512 and a third microlens 513. The second microlens 512 may be provided on the second color filters CF2. The third microlens 513 may be provided on the third color filter CF3. When viewed in plan, the second and third microlenses 512 and 513 may be arranged along the first and second directions D1 and D2, thereby constituting an array. The second and third microlenses 512 and 513 may protrude away from the first surface 100*a* of the first substrate 100. The second and third microlenses 512 and 513 may each have a hemispherical cross-section. The second and third microlenses 512 and 513 may concentrate incident light, and the incident light may be blocked by the filtering layer 550.

The lens coating layer 530 may be provided on the microlens layer 500. The lens coating layer 530 may include a first coating layer LTO and a second coating layer ALO. For example, the first coating layer LTO may include a silicon oxide layer formed by plasma enhance chemical vapor deposition (PECVD). The second coating layer ALO may include a silicon oxide layer formed by atomic layer deposition (ALD). The first coating layer LTO and the second coating layer ALO may include the same silicon-based dielectric material.

As the first coating layer LTO is formed by PECVD, the first coating layer LTO may be a porous layer whose density is low. For example, the first coating layer LTO may have an irregular thickness. As the second coating layer ALO is formed by ALD, the second coating layer ALO may be dense with a density greater than that of the first coating layer LTO. As the second coating layer ALO is conformally formed by ALD, the second coating layer ALO may have a regular thickness. As the lens coating layer 530 includes the first coating layer LTO and additionally includes the second coating layer ALO formed by ALD, the occurrence of valley may be prevented in a process where the lens coating layer 530 is deposited. It may thus be possible to prevent process defects such as a void VD that is created in the microlens layer 500. Accordingly, embodiments of the present disclosure may allow the image sensor to have improved reliability and performance.

A second through structure 920 may be disposed adjacent to a second side of the external bonding pad 600 which will be discussed below. The second through structure 920 may be provided on the pad region PDR. The second through structure 920 may include a second through hole 902, a second conductive pattern 912, and a second buried pattern 922 on the second conductive pattern 912.

The second through hole 902 may penetrate the dielectric layer 400, the first substrate 100, and the first wiring layer 800. The second through hole 902 may further penetrate a portion of the second wiring layer 1800 to expose the second conductive structure 1830.

The second conductive pattern 912 may be provided on the pad region PDR. The second conductive pattern 912 may be provided in the second through hole 902 to conformally cover a sidewall and a bottom surface of the second through hole 902. The second conductive pattern 912 may be electrically connected to the second conductive structure 1830.

The second conductive pattern 912 may be interposed between the external bonding pad 600 and a subsequently described pad trench 990 to cover a bottom surface and a sidewall of the external bonding pad 600. When the image sensor operates, integrated circuits 1700 of the circuit chip 20 may transceive electrical signals through the second conductive structure 1830, the second conductive pattern 912, and the external bonding pad 600.

The second buried pattern 922 may be provided in the second through hole 902, thereby filling the second through hole 902. The second buried pattern 922 may include a low-refractive material and may have dielectric properties. For example, the second buried pattern 922 may include the same material as that of the first fence pattern 310. The second buried pattern 922 may have a recess on a top surface thereof.

A first capping pattern 932 may be disposed on the top surface of the second buried pattern 922 to fill the recess of the second buried pattern 922. A top surface of the first capping pattern 932 may be substantially flat. The first capping pattern 932 may include a dielectric polymer, such as a photoresist material.

The protective dielectric layer 471 may extend from the optical black region OBR onto the pad region PDR. The protective dielectric layer 471 may be provided on the top surface of the dielectric layer 400 and may extend into the first through hole 901 and the second through hole 902. In the first through hole 901, the protective dielectric layer 471 may be interposed between the first conductive pattern 911 and the first buried pattern 921. In the second through hole 902, the protective dielectric layer 471 may be interposed between the second conductive pattern 912 and the second buried pattern 922. The protective dielectric layer 471 may expose the external bonding pad 600.

Referring back to FIG. 3A, the first color filter CF1 may have a first width FS1 in the first direction D1. The first width FS1 may be a length or width in the first direction D1 of the first color filter CF1. The first width FS1 may be a length or width between the fence patterns 300 disposed on opposite sides of the first color filter CF1. For example, the first width FS1 may range from about 0.4 μm to about 0.6 μm.

The second color filter CF2 may have a second width FS2 in the first direction D1. The second width FS2 may be a length or width in the first direction D1 of the second color filter CF2. The second width FS2 may be greater than the first width FS1. The second width FS2 may be about 1.5 times to about 2.5 times the first width FS1. For example, the second width FS2 may range from about 0.8 μm to about 1.2 μm.

The third color filter CF3 may have a third width FS3 in the first direction D1. The third width FS3 may be a length or width in the first direction D1 of the third color filter CF3. The second width FS2 may be the same as the third width FS3. The third width FS3 may be about 1.5 times to about 2.5 times the first width FS1.

No fence pattern may be formed between the second and third color filters CF2 and CF3 on the optical black region OBR, which may result in the occurrence of a lifting phenomenon. The lifting phenomenon may occur due to a small bonding or adhesion force between the protective dielectric layer 471 and the second and third color filters CF2 and CF3.

Figure 6:
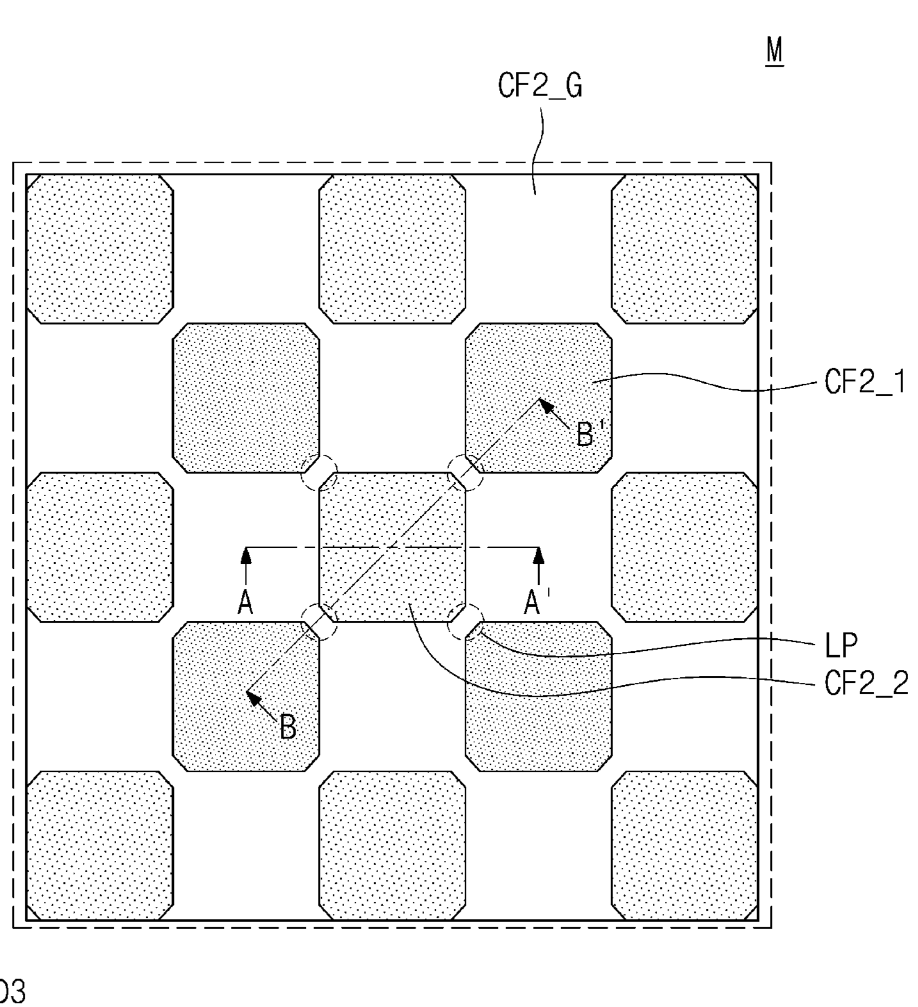
FIG. 6 illustrates a plan view of section M depicted in FIG. 2, showing color filters of an image sensor according to one or more embodiments of the disclosure.
Figure 6:
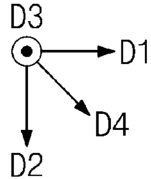

According to one or more embodiments of the disclosure, as the second width FS2 of the second color filter CF2 and the third width FS3 of the third color filter CF3 are about 1.5 times to about 2.5 times the first width FS1 of the first color filter CF1, the second and third color filters CF2 and CF3 may be uniformly coated and attached. It may thus be possible to prevent a lifting phenomenon of the second and third color filters CF2 and CF3. In addition, as a plurality of color filters are formed in a Bayer pattern as shown in FIG. 6 which will be discussed below, each of the color filters may be fixed with no fence pattern to thereby prevent a lifting phenomenon. Accordingly, one or more embodiments of the present disclosure may allow the image sensor to have improved reliability and performance.

The first microlens 511 may have a fourth width MLS1 in the first direction D1. The fourth width MLS1 may be about 0.8 times to about 1.2 times the first width FS1. The fourth width MLS1 may be the same as the first width FS1. The second microlens 512 may have a fifth width MLS2 in the first direction D1. The fifth width MLS2 may be about 0.5 times to about 1.0 times the second width FS2. The fifth width MLS2 may be about 0.8 times to about 1.2 times the fourth width MLS1. For example, the fifth width MLS2 may be the same as the fourth width MLS1.

The third microlens 513 may have a sixth width MLS3 in the first direction D1. The third width FS3 may be about 0.8 times to about 1.2 times the sixth width MLS3. The sixth width MLS3 may be the same as the third width FS3. The sixth width MLS3 may be greater than the fourth width MLS1 and the fifth width MLS2.

The first through hole 901 of the first through structure 910 may have a seventh width HS in the first direction D1. The seventh width HS may be about 0.8 times to about 1.2 times the third width FS3. The seventh width HS may be about 0.8 times to about 1.2 times the sixth width MLS3. The third width FS3, the sixth width MLS3, and the seventh width HS may be the same as each other. The third width FS3, the sixth width MLS3, and the seventh width HS may have a length ratio of 1:1:1.

As the second and third microlenses 512 and 513 are formed on the filtering layer 550 on the optical black region OBR, it may be possible to prevent a lifting phenomenon of the first microlens 511 on the pixel array region APS. When only the first microlens 511 on the pixel array region APS has a hemispherical cross-section, a stress or force applied to an entirety of the microlens layer 500 may be concentrated on some lens, and therefore, a lifting phenomenon may occur.

According to one or more embodiments of the disclosure, the first, second, and third microlenses 511, 512, and 513 may each have a hemispherical cross-section, and the fourth width MLS1, the fifth width MLS2, and the sixth width MLS3 of the first, second, and third microlenses 511, 512, and 513 may be the same as each other or may gradually increase. Therefore, a stress or force applied to an entirety of the microlens layer 500 may be uniformly distributed to prevent a lifting phenomenon. Accordingly, embodiments of the present disclosure may allow the image sensor to have improved reliability and performance.

The image sensor may further include the circuit chip 20. The circuit chip 20 may be stacked on the sensor chip 10. The circuit chip 20 may include a second wiring layer 1800 and a second substrate 1000. The second wiring layer 1800 may be interposed between the first wiring layer 800 and the second substrate 1000. Integrated circuits 1700 may be located on a top surface or in an inside of the second substrate 1000. The integrated circuits 1700 may include logic circuits, memory circuits, or any combination thereof. The integrated circuits 1700 may include, for example, transistors.

The second wiring layer 1800 may include third interlayer dielectric layers 1820 and a second conductive structure 1830. The second conductive structures 1830 may be provided between or in the third interlayer dielectric layers 1820. The second conductive structures 1830 may be electrically connected to the integrated circuits 1700. The second conductive structures 1830 may further include via patterns, and the via patterns and the second conductive structures 1830 may be coupled to each other in the third interlayer dielectric layers 1820.

An external bonding pad 600 may be provided on the pad region PDR of the first substrate 100. The external bonding pad 600 may be adjacent to the first surface 100*a* of the first substrate 100. The external bonding pad 600 may be buried in the first substrate 100. For example, a pad trench 990 may be defined on the first surface 100*a* of the first substrate 100 on the pad region PDR, and the external bonding pad 600 may be provided in the pad trench 990. The external bonding pad 600 may include metal, such as aluminum, copper, tungsten, titanium, tantalum, or any alloy thereof. In a mounting process of the image sensor, a bonding wire may be formed on and coupled to the external bonding pad 600. The external bonding pad 600 may be electrically connected through a bonding wire to an external apparatus.

Figure 4A:
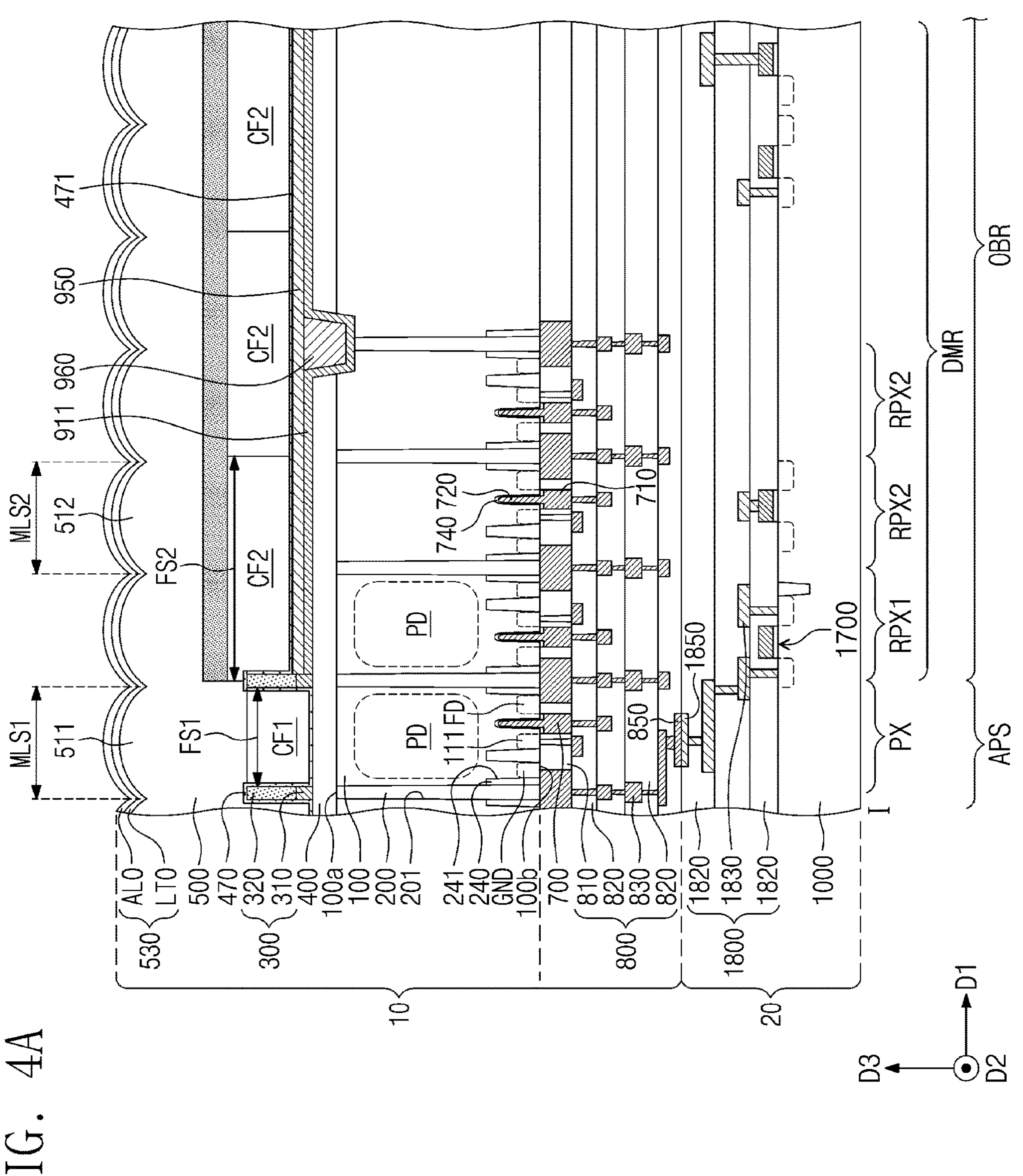
Figure 4B:
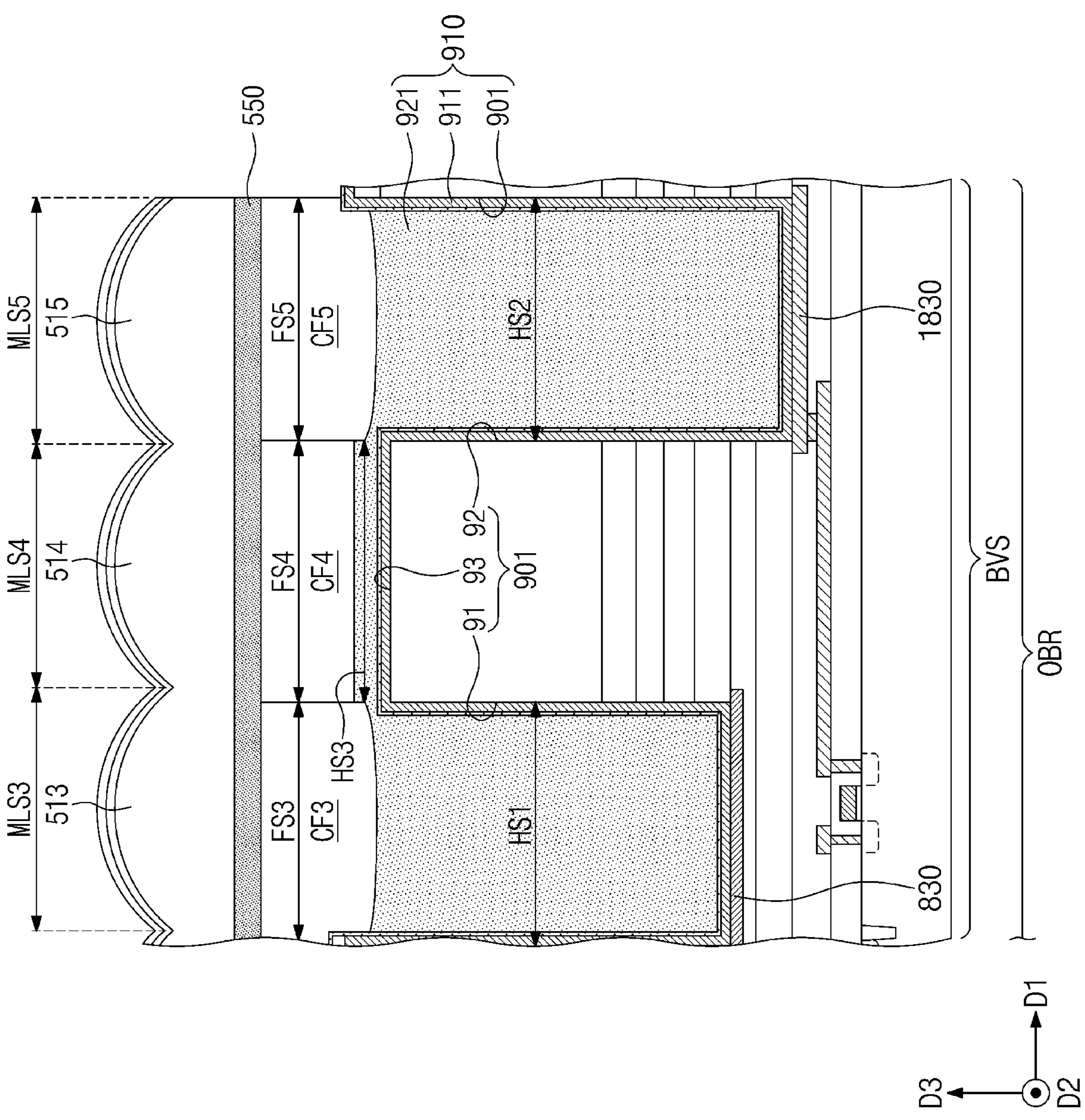
Figure 4C:
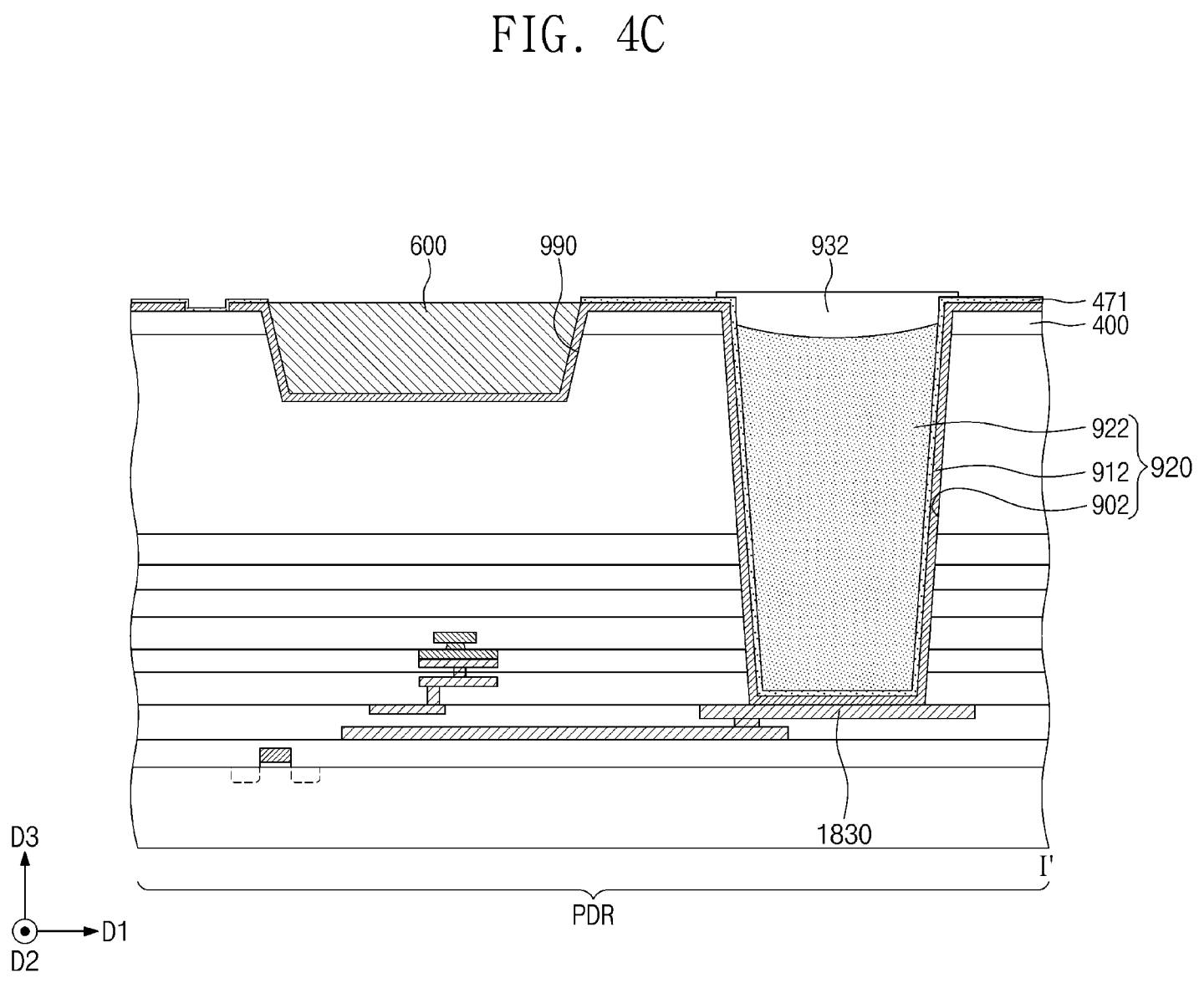

FIGS. 4A to 4C illustrate cross-sectional views taken along line I-I' of FIG. 2, showing an image sensor according to one or more embodiments of the disclosure. In the embodiment that follows, a detailed description of technical features repetitive to those discussed above with reference to FIGS. 1 to 3B will be omitted, and a difference thereof will be explained in detail.

Referring to FIGS. 2 and 4A to 4C, an image sensor may include a sensor chip 10 and a circuit chip 20. The sensor chip 10 may include a first connection pad 850. The first connection pad 850 may be exposed on a bottom surface of the sensor chip 10. The first connection pad 850 may be disposed in a lowermost second interlayer dielectric layer 820. The first connection pad 850 may be electrically connected to the first conductive structure 830. The first connection pad 850 may include a conductive material, such as metal. For example, the first connection pad 850 may include copper. Alternatively, the first connection pad 850 may include one or more of aluminum, tungsten, titanium, or any alloy thereof.

The circuit chip 20 may include a second connection pad 1850. The second connection pad 1850 may be exposed on a top surface of the circuit chip 20. The second connection pad 1850 may be disposed in an uppermost third interlayer dielectric layer 1820. The second connection pad 1850 may be electrically connected to the integrated circuit 1700. The second connection pad 1850 may include a conductive material, such as metal. For example, the second connection pad 1850 may include copper. Alternatively, the second connection pad 1850 may include one or more of aluminum, tungsten, titanium, or any alloy thereof.

The circuit chip 20 and the sensor chip 10 may be connected to each other by direct bonding. For example, the first connection pad 850 and the second connection pad 1850 may be vertically aligned and in contact with each other. Therefore, the second connection pad 1850 may be directly bonded to the first connection pad 850. As a result, the integrated circuits 1700 of the circuit chip 20 may be electrically connected through the first and second connection pads 850 and 1850 to the external bonding pads 600 or transistors of the sensor chip 10.

The second interlayer dielectric layer 820 may be directly attached to the third interlayer dielectric layer 1820. In this case, a chemical bond may be formed between the second interlayer dielectric layer 820 and the third interlayer dielectric layer 1820.

Referring back to FIG. 4B, a first through structure 910 may be disposed adjacent to a first side of the external bonding pad 600. The first through structure 910 may be provided on the line connection region BVS. The first through structure 910 may include a first through hole 901, a first conductive pattern 911 on lateral and bottom surfaces of the first through hole 901, and a first buried pattern 921 on the first conductive pattern 911.

The first through hole 901 may include a first through hole part 91, a second through hole part 92, and a third through hole part 93. The first through hole part 91 may penetrate the dielectric layer 400, the first substrate 100, and the first wiring layer 800, and may have a first bottom surface. The second through hole part 92 may penetrate the dielectric layer 400, the first substrate 100, and the first wiring layer 800, and may extend into an upper portion of the second wiring layer 1800. The second through hole part 92 may have a second bottom surface, and the second bottom surface may expose a top surface of the second conductive structure 1830. The second through hole part 92 may have a sidewall spaced apart from that of the first through hole part 91. The third through hole part 93 may be provided between and connected to an upper portion of the first through hole part 91 and an upper portion of the second through hole part 92. The first through hole 901 may be provided therein with the first conductive pattern 911, the protective dielectric layer 471, and the first buried pattern 921. The first conductive pattern 911 may cover inner walls of the first, second, and third through hole parts 91, 92, and 93.

A third color filter CF3, a fourth color filter CF4, and a fifth color filter CF5 may be respectively disposed on the first through hole part 91, the third through hole part 93, and the second through hole part 92. The filtering layer 550 may extend from the second color filters CF2 onto the fifth color filter CF5. A third microlens 513, a fourth microlens 514, and a fifth microlens 515 may be respectively provided on the third color filter CF3, the fourth color filter CF4, and the fifth color filter CF5. The third, fourth, and fifth microlenses 513, 514, and 515 may be provided on the filtering layer 550.

The third color filter CF3 may have a third width FS3 in the first direction D1. The third width FS3 may be a length or width in the first direction D1 of the third color filter CF3. The third microlens 513 may have a sixth width MLS3 in the first direction D1. The sixth width MLS3 may be a length or width in the first direction D1. The first through hole part 91, the third color filter CF3, and the third microlens 513 may respectively correspond to or may be respectively the same as the first through hole 901 of FIG. 3A, the third color filter CF3 of FIG. 3A, and the third microlens 513 of FIG. 3A.

The first through hole part 91 may have a first distance HS1 in the first direction D1. The first distance HS1 may correspond to the seventh width HS of FIG. 3A. For example, the first distance HS1 may be about 0.8 times to about 1.2 times the third width FS3. The first distance HS1 may be about 0.8 times to about 1.2 times the sixth width MLS3. The third width FS3, the sixth width MLS3, and the first distance HS1 may be the same as each other. The third width FS3, the sixth width MLS3, and the first distance HS1 may have a length ratio of 1:1:1.

The second through hole part 92 may have a second distance HS2 in the first direction D1. The third through hole part 93 may have a third distance HS3 in the first direction D1. The first, second, and third distances HS1, HS2, HS3 may be the same as each other.

The fourth color filter CF4 may have a fourth distance FS4 in the first direction D1. The fifth color filter CF5 may have a fifth distance FS5 in the first direction D1. The third width FS3, the fourth distance FS4, and the fifth distance FS5 may be the same as each other.

The fourth microlens 514 may have a sixth distance MLS4 in the first direction D1. The fifth microlens 515 may have a seventh distance MLS5 in the first direction D1. The sixth width MLS3, the sixth distance MLS4, and the seventh distance MLS5 may be the same as each other.

The number of color filters and the number of microlenses may be changed in accordance with a shape of the first through structure 910 on the line connection region BVS. A size of each of color filters and microlenses may be changed in accordance with sizes of the first, second, and third through hole parts 91, 92, and 93 of the first through structure 910. Therefore, lifting phenomena of a plurality of color filters and microlenses may be prevented to increase reliability of the image sensor.

Figure 5:
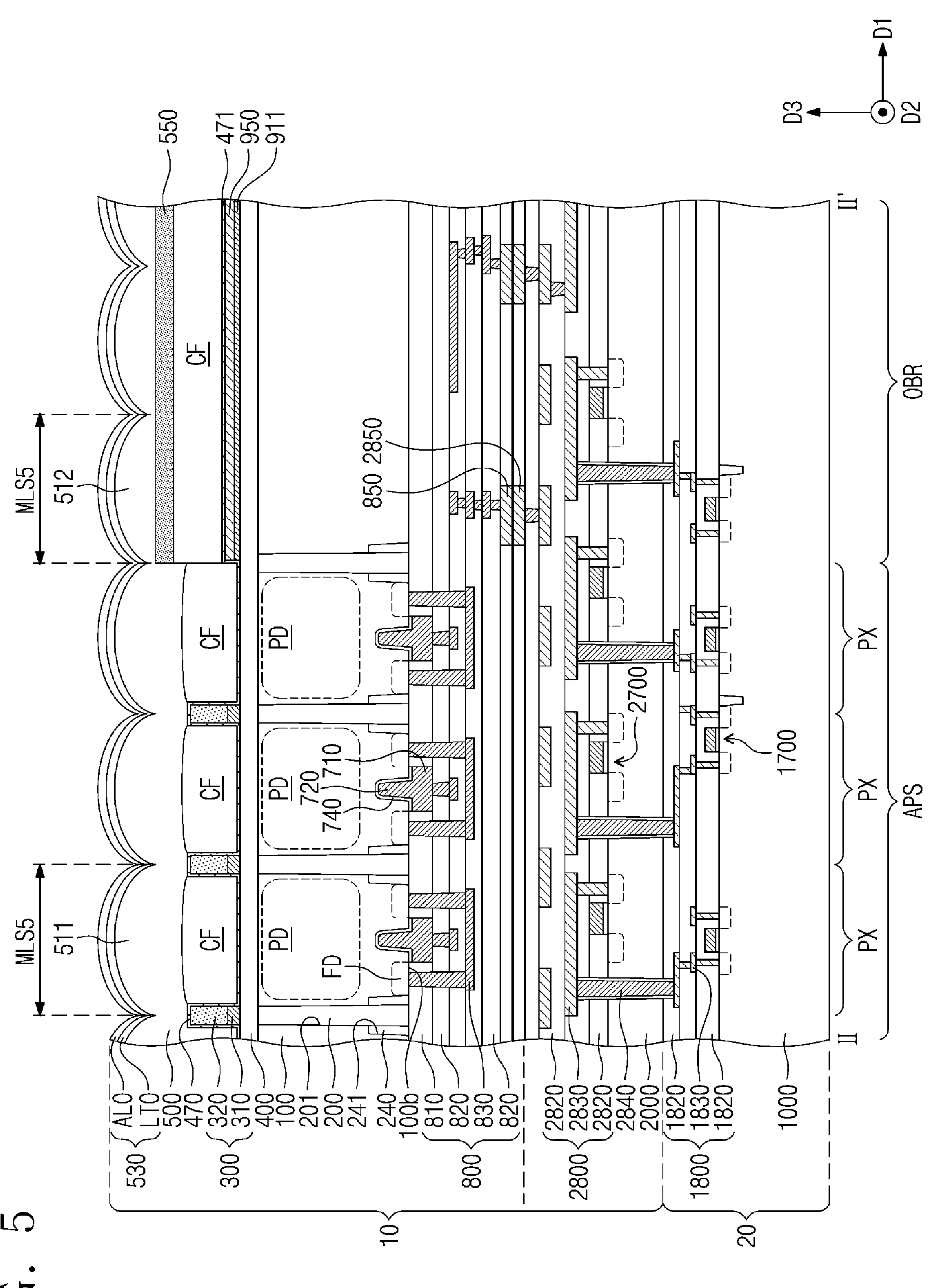
FIG. 5 illustrates a cross-sectional view taken along line II-II' of FIG. 2.

FIG. 5 illustrates a cross-sectional view taken along line II-II' of FIG. 2, showing an image sensor according to one or more embodiments of the disclosure. In the embodiment that follows, a detailed description of technical features repetitive to those discussed with reference to FIGS. 1 to 4C will be omitted, and a difference thereof will be discussed in detail.

Referring to FIGS. 2 and 5, an image sensor may further include a middle chip 30 interposed between the sensor chip 10 and the circuit chip 20. The middle chip 30 may include a third wiring layer 2800 and a third substrate 2000. The third wiring layer 2800 may be interposed between the first wiring layer 800 and the third substrate 2000. The second wiring layer 1800 of the circuit chip 20 may be provided below the third substrate 2000.

The third substrate 2000 may be provided with driver transistors 2700 on a top surface thereof. The driver transistors 2700 may include the conversion gain transistor Cx, the reset transistor Rx, the source follower transistor Sx, and the selection transistor Ax that are discussed with reference to FIG. 1. According to the present embodiment, the photoelectric conversion area PD, the transfer transistor Tx, and the floating diffusion area FD of FIG. 1 may be provided in or on the first substrate 100 of the sensor chip 10. The middle chip 30 may be provided on the third substrate 2000 with the conversion gain transistor Cx, the reset transistor Rx, the source follower transistor Sx, and the selection transistor Ax of FIG. 1.

The third wiring layer 2800 may include fourth interlayer dielectric layers 2820 and third conductive structures 2830. The third conductive structures 2830 may be provided between or in the fourth interlayer dielectric layers 2820. The third conductive structures 2830 may be electrically connected to the driver transistors 2700. The third conductive structures 2830 may include contacts, wiring lines, and vias.

The sensor chip 10 may include a first connection pad 850. The first connection pad 850 may be exposed on a bottom surface of the sensor chip 10. The first connection pad 850 may be disposed in a lowermost second interlayer dielectric layer 820. The first connection pad 850 may be electrically connected to the first conductive structure 830.

The middle chip 30 may include a third connection pad 2850. The third connection pad 2850 may be exposed on a top surface of the middle chip 30. The third connection pad 2850 may be disposed in an uppermost fourth interlayer dielectric layer 2820. The third connection pad 2850 may be electrically connected to the driver transistors 2700. The third connection pad 2850 may include a conductive material, such as metal. For example, the third connection pad 2850 may include copper. For another example, the third connection pad 2850 may include one or more of aluminum, tungsten, titanium, or any alloy thereof.

The middle chip 30 and the sensor chip 10 may be connected to each other by direct bonding. For example, the first connection pad 850 and the third connection pad 2850 may be vertically aligned and in contact with each other. Therefore, the third connection pad 2850 may be directly bonded to the first connection pad 850. As a result, the driver transistors 2700 of the middle chip 30 may be electrically connected through the first and third connection pads 850 and 2850 to the floating diffusion areas FD of the sensor chip 10.

The second interlayer dielectric layer 820 may be directly attached to the fourth interlayer dielectric layer 2820. In this case, a chemical bond may be formed between the second interlayer dielectric layer 820 and the fourth interlayer dielectric layer 2820.

The middle chip 30 may further include through vias 2840 that penetrate the third substrate 2000. Each of the through vias 2840 may electrically connect the third wiring layer 2800 to the second wiring layer 1800. For example, the middle chip 30 and the circuit chip 20 may be electrically connected to each other through the through vias 2840.

Figure 7A:
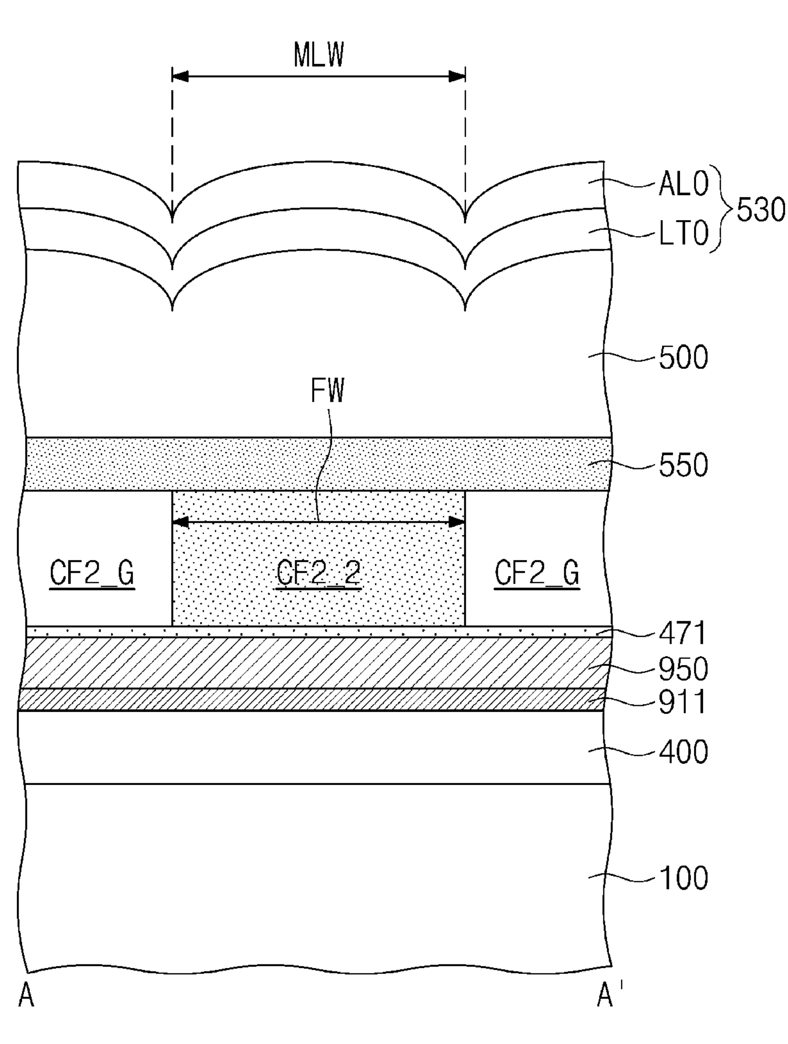
FIG. 7A illustrates a cross-sectional view taken along line A-A' of FIG. 6.
Figure 7A:
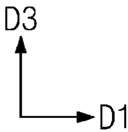
Figure 7B:
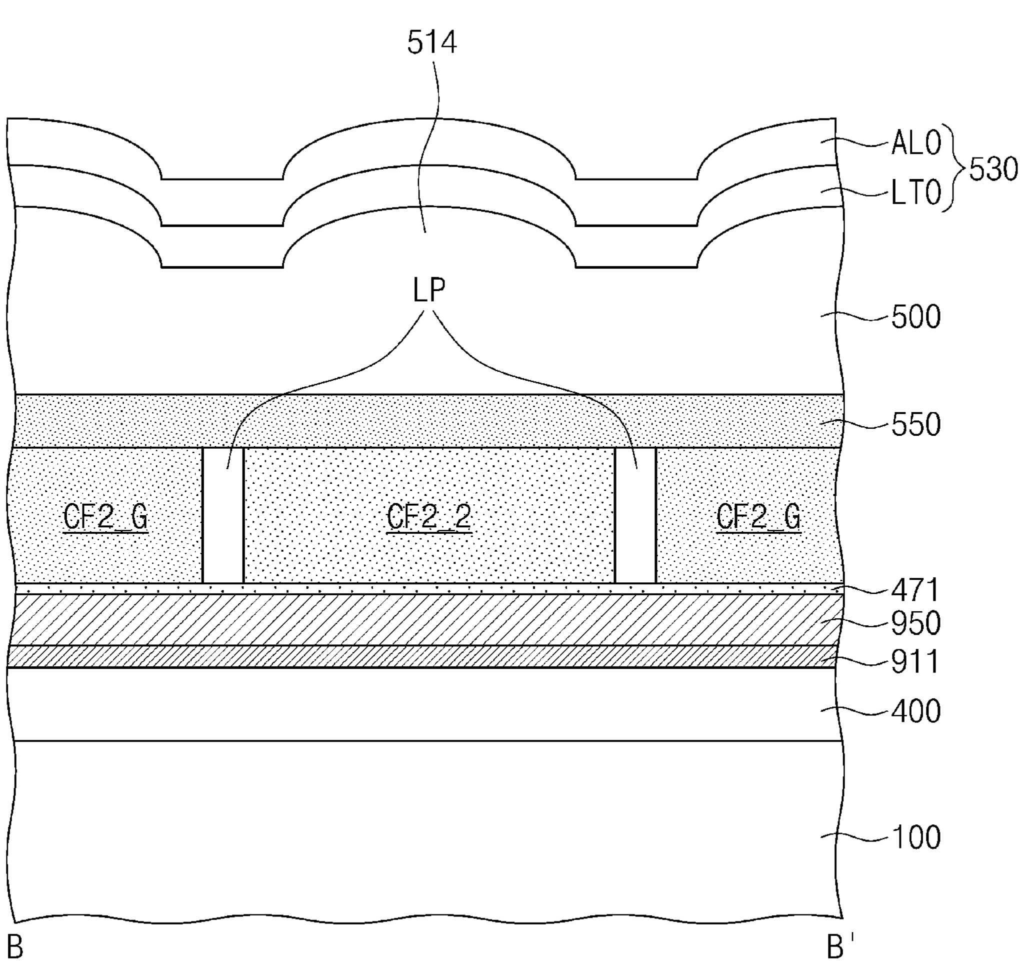
FIG. 7B illustrates a cross-sectional view taken along line B-B' of FIG. 6.

FIG. 6 illustrates a plan view of section M depicted in FIG. 2, showing color filters according to one or more embodiments of the disclosure. FIG. 7A illustrates a cross-sectional view taken along line A-A' of FIG. 6. FIG. 7B illustrates a cross-sectional view taken along line B-B' of FIG. 6. In the embodiment that follows, a detailed description of technical features repetitive to those discussed with reference to FIGS. 1 to 5 will be omitted, and a difference thereof will be discussed in detail.

Referring to FIGS. 6, 7A, and 7B, an image sensor may include a first substrate 100. The image sensor may further include a dielectric layer 400, a first conductive pattern 911, a light-shield layer 950, a protective dielectric layer 471, sub-color filters CF2_1, CF2_2, and CF2_G, a link pattern LP, a filtering layer 550, a microlens layer 500, and a lens coating layer 530 that are provided on a first surface of the first substrate 100 on the optical black region (see OBR of FIG. 2). In the present embodiment, components below the first substrate 100 are omitted from illustration, and a detailed description thereof is the same as described with reference to FIGS. 3A to 5.

The optical black region (see OBR of FIG. 2) of the first substrate 100 may include a color filter array. The color filter array may include a first sub-color filter CF2_1, a second sub-color filter CF2_2, and two third sub-color filters CF2_G. For example, the third sub-color filter CF2_G may include a green filter. The first sub-color filter CF2_1 and the second sub-color filter CF2_2 may include a blue filter or a red filter. Alternatively, the first, second, and third sub-color filters CF2_1, CF2_2, and CF2_G may include a white color filter or a blue bulk.

The color filter array may include a Bayer pattern constituted by the first sub-color filter CF2_1, the second sub-color filter CF2_2, and two third sub-color filters CF2_G. When viewed in plan, the third sub-color filters CF2_G may surround the first sub-color filter CF2_1 and the second sub-color filter CF2_2. The first sub-color filter CF2_1 and the second sub-color filter CF2_2 may be two-dimensionally arranged (see FIG. 6).

The Bayer pattern may include a link pattern LP that is interposed between the first sub-color filter CF2_1 and the second sub-color filter CF2_2 and connects the two third sub-color filters CF2_G to each other. The placement of the link pattern LP may allow the first sub-color filter CF2_1 and the second sub-color filter CF2_2 to have an octagonal shape when viewed in plan.

A grid-shape fence pattern (see 300 of FIG. 3) may not be provided on the protective dielectric layer 471 on the optical black region (see OBR of FIG. 2). For example, a grid shape may be given to the link pattern LP and a portion of the third sub-color filter CF2_G adjacent to a lateral surface of one of the first and second sub-color filters CF2_1 and CF2_2, and thus the first and second sub-color filters CF2_1 and CF2_2 may be fixed. Accordingly, it may be possible to prevent a lifting phenomenon of the first and second sub-color filters CF2_1 and CF2_2.

As will be discussed in a subsequent fabrication method, the first, second, and third sub-color filters CF2_1, CF2_2, and CF2_G may be sequentially formed. For example, the third sub-color filters CF2_G, or green filters, may be first formed, and then the second sub-color filters CF2_2 may be formed. Before the first sub-color filters CF2_1 are formed, an etching process may be performed to remove a pigment of the second sub-color filters CF2_2.

A microlens layer 500 may be provided on the filtering layer 550. The lens coating layer 530 may be provided on the microlens layer 500. The lens coating layer 530 may include a first coating layer LTO and a second coating layer ALO. The first and second coating layers LTO and ALO may be the same as described above.

The microlens layer 500 may include a microlens that protrudes away from the first surface of the first substrate 100 and a flat part on the link pattern LP. The microlens may have a hemispherical cross-section. The flat part may be interposed between the microlenses.

Referring back to FIG. 7A, the second sub-color filter CF2_2 may have a first width FW in the first direction D1, and the microlens may have a second width MLW in the first direction D1. The first width FW and the second width MLW may be the same as each other. For example, the microlenses may be provided to correspond to the first, second, and third sub-color filters CF2_1, CF2_2, and CF2_G.

FIGS. 8A to 8C, 9A to 9C, 10A to 10C, and 11A to 11C illustrate diagrams showing a method of fabricating an image sensor according to one or more embodiments of the disclosure. In detail, FIGS. 8A, 9A, 10A, and 11A illustrate plan views that correspond to FIG. 6. FIGS. 8B, 9B, 10B, and 11B illustrate cross-sectional views taken along line A-A' of corresponding plan views. FIGS. 8C, 9C, 10C, and 11C illustrate cross-sectional views taken along line B-B' of corresponding plan views.

Figure 8A:
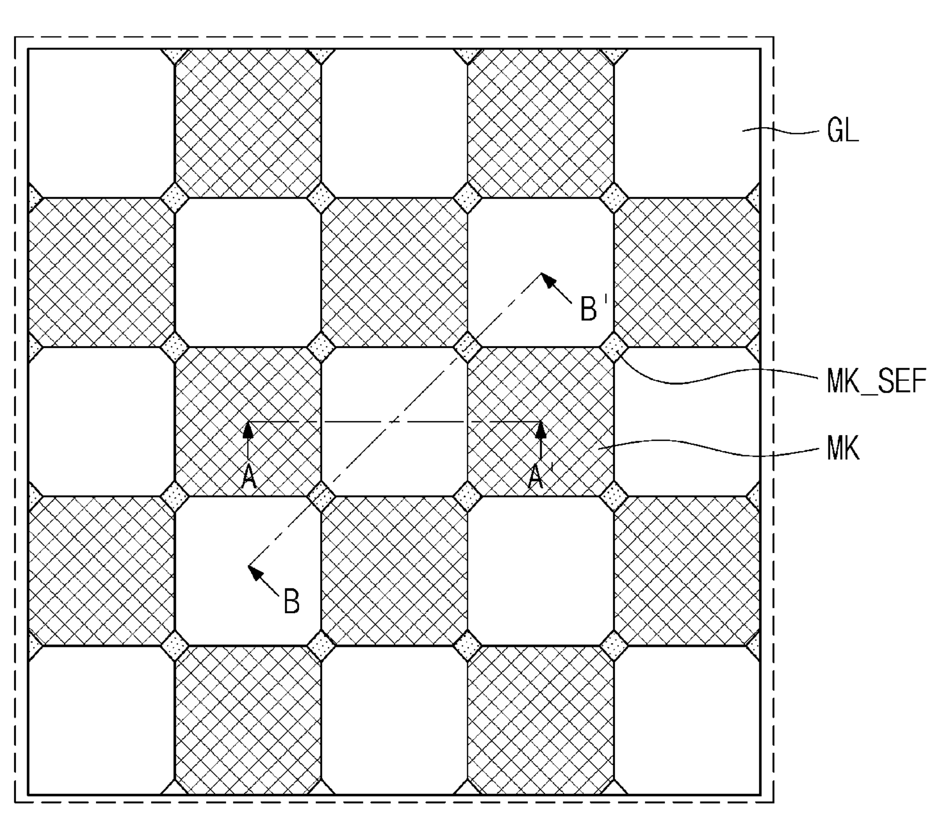
FIGS. 8A to 8C, 9A to 9C, 10A to 10C, and 11A to 11C illustrate diagrams showing a method of fabricating an image sensor according to one or more embodiments of the disclosure.
Figure 8A:
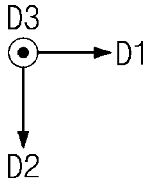
Figure 8B:
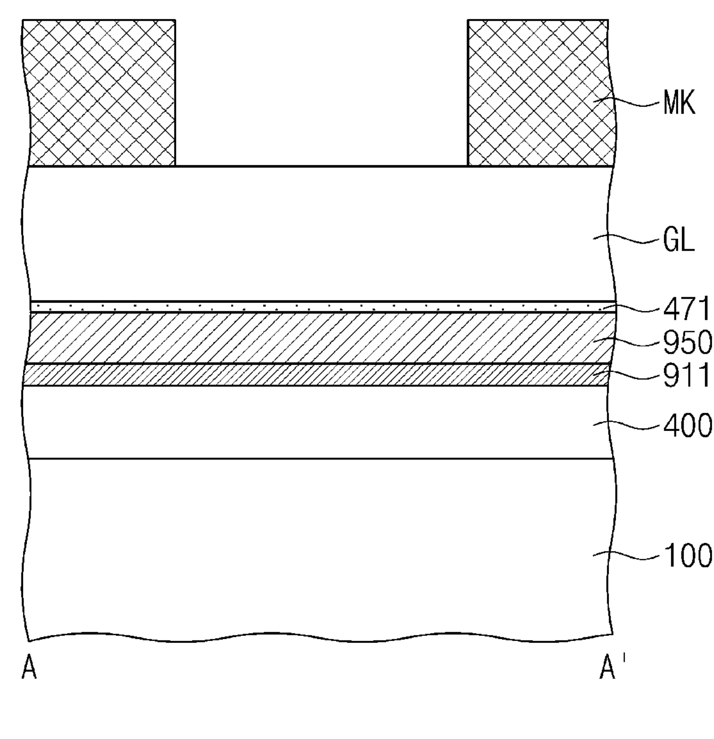
Figure 8C:
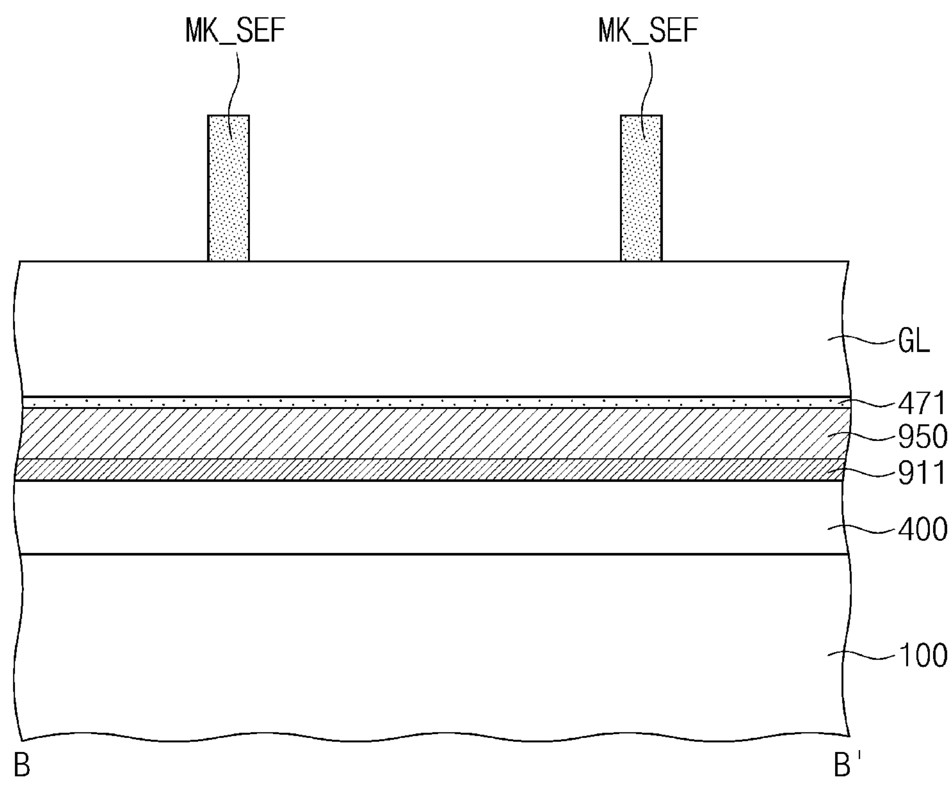

Referring to FIGS. 8A to 8C, a first substrate 100 may be provided which includes an optical black region (see OBR of FIG. 2). A dielectric layer 400 may be formed on a planarized first surface of the first substrate 100. In an embodiment, the formation of the dielectric layer 400 may include sequentially stacking first to fifth dielectric layers on the first surface. The first dielectric layer may be formed to directly cover the first surface. The first and second dielectric layers may be fixed charge layers. The third dielectric layer may be formed of a silicon oxide layer, and the fourth dielectric layer may be formed of a silicon nitride layer. The fifth dielectric layer may be an adhesive layer or a capping layer.

A first conductive pattern 911 and a light-shield layer 950 may be sequentially formed on the dielectric layer 400. The first conductive pattern 911 may be formed of a conductive material such as metal nitride. The light-shield layer 950 may be formed of a conductive material such as one or more of metal and metal nitride. A protective dielectric layer 471 may be formed on the light-shield layer 950.

A third sub-color filter layer GL may be directly formed on the protective dielectric layer 471. The formation of the third sub-color filter layer GL may include employing a coating process in which the protective dielectric layer 471 is coated with a photoresist composition including a green pigment.

A photomask pattern MK may be formed on the third sub-color filter layer GL. For example, the formation of the photomask pattern MK may include employing a coating process in which the third sub-color filter layer GL is coated with a block layer including a photoresist composition, performing a soft bake process on the block layer, performing an exposure process on the block layer, and developing the block layer to leave the photomask pattern MK. The photomask pattern MK may have a tetragonal shape that is two-dimensionally repeated.

The photomask pattern MK may have a corner part MK_SEF. The corner part MK_SEF may be disposed at an edge of the photomask pattern MK. An optical proximity correction (OPC) technique may be employed to form the corner part MK_SEF. For example, when viewed in plan, a small pattern whose size is less than a resolution may be added on each of edges of the photomask pattern MK, thereby forming the corner part MK_SEF. The corner part MK_SEF may include the same material as that of the photomask pattern MK.

Figure 9A:
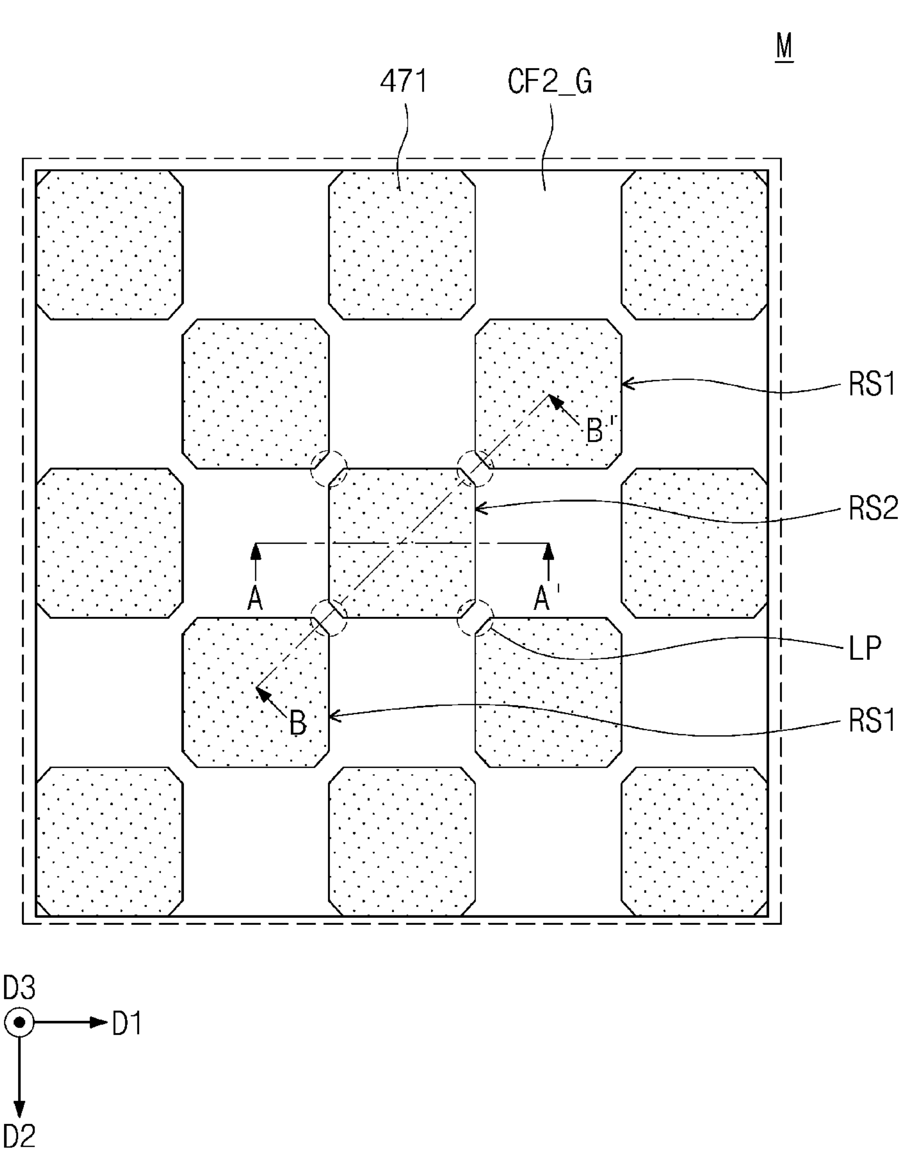
Figure 9B:
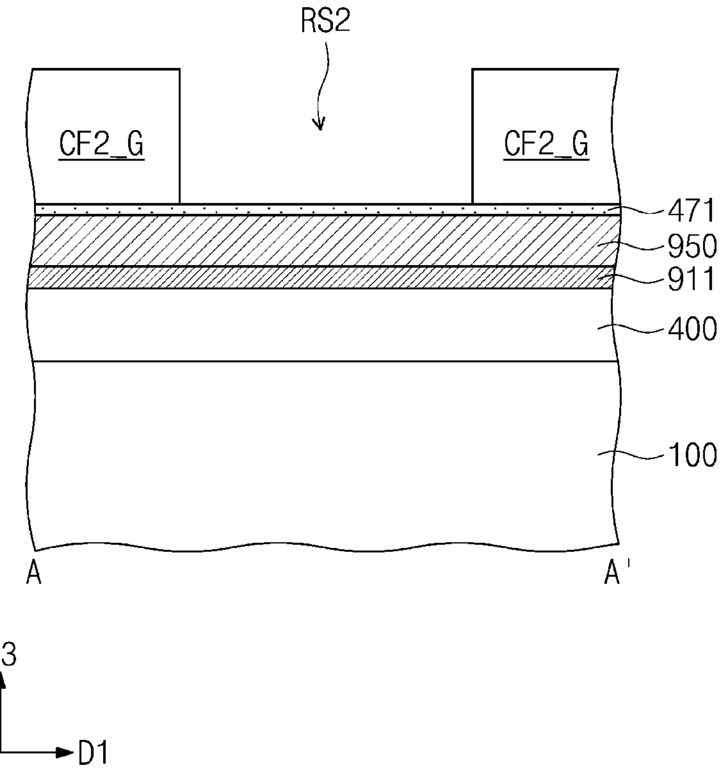
Figure 9C:
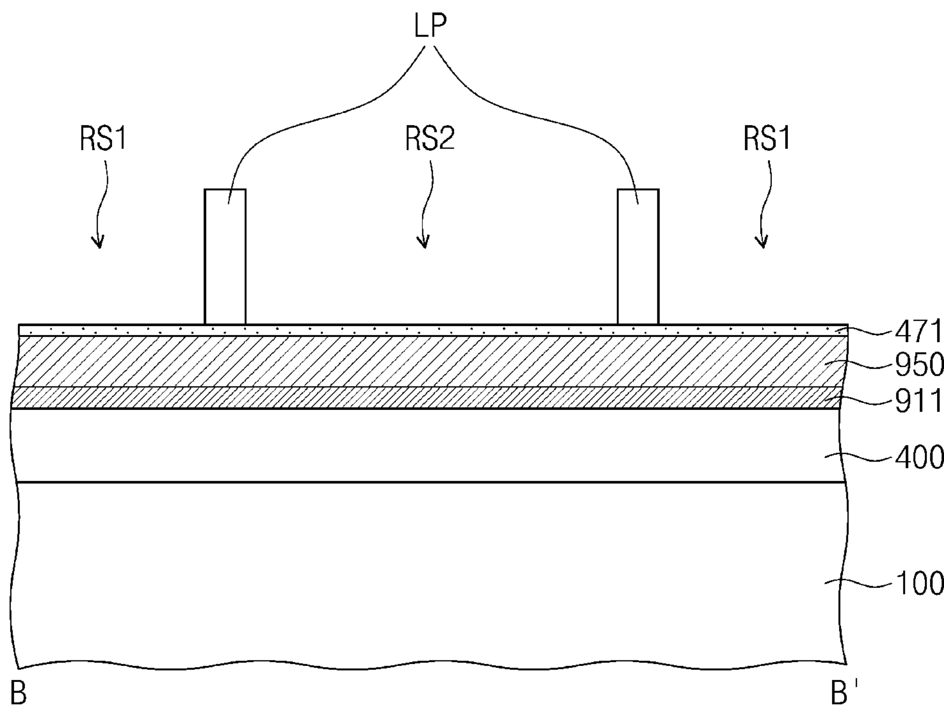

Referring to FIGS. 9A to 9C, the photomask pattern (see MK of FIG. 8B) and the corner part (see MK_SEF of FIG. 8C) may be used as a mask to remove a portion of the third sub-color filter layer GL. A dry etching process may be perform to remove a portion of the third sub-color filter layer GL. Alternatively, a portion of the third sub-color filter layer GL may be removed by performing an exposure process on the third sub-color filter layer GL and developing the third sub-color filter layer GL.

The partial removal of the third sub-color filter layer GL may form first recesses RS1 and second recesses RS2. A portion of the third sub-color filter layer GL may be removed to form third sub-color filters CF2_G. The third sub-color filter CF2_G may include a link pattern LP. The link pattern LP may be interposed between the first recess RS1 and the second recess RS2 to connect two third sub-color filters CF2_G to each other. The third sub-color filters CF2_G may have their top surfaces substantially the same as that of the link pattern LP.

Figure 10A:
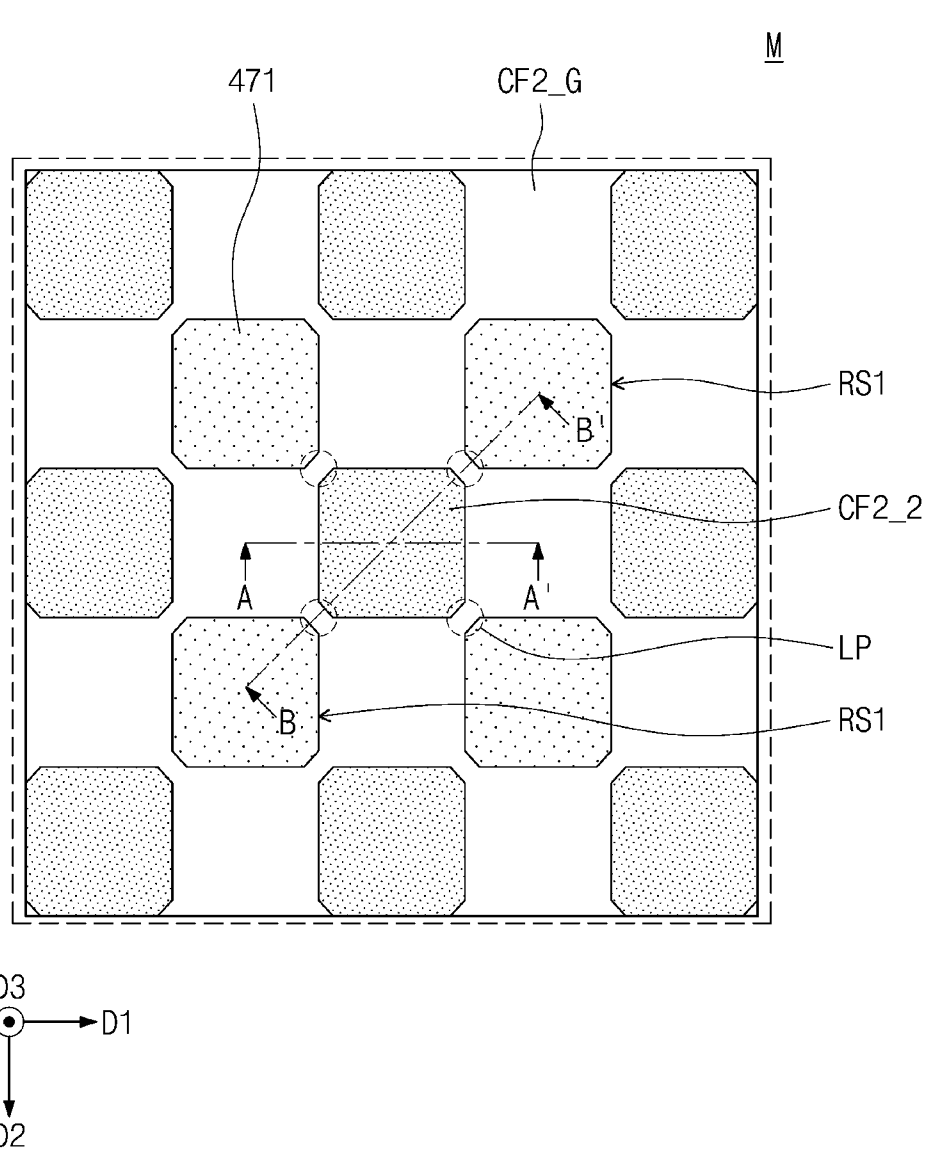
Figure 10B:
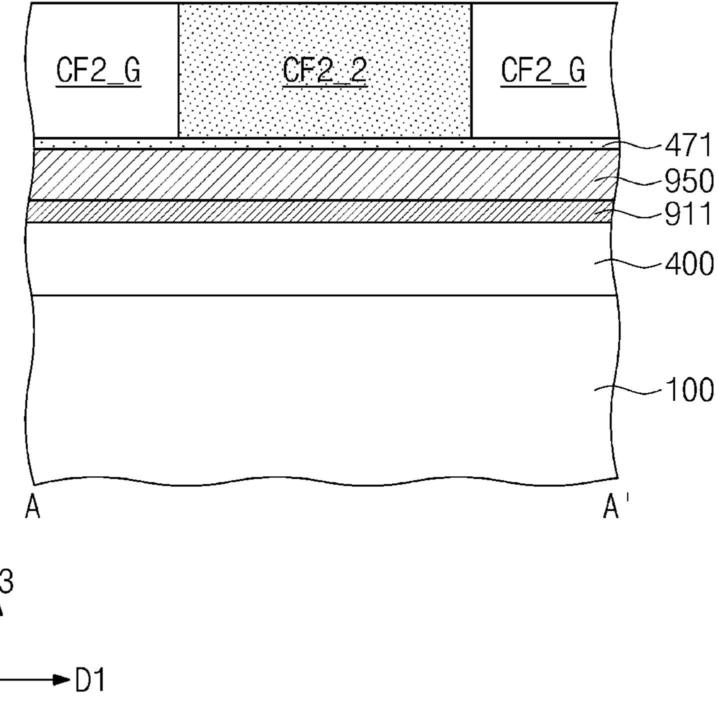
Figure 10C:
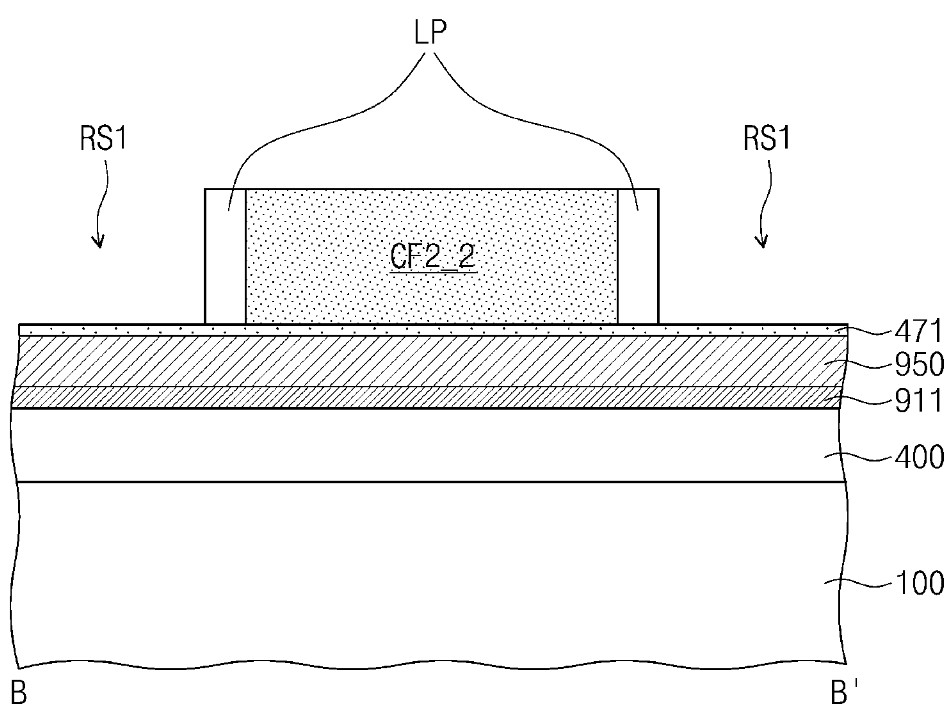

Referring to FIGS. 10A to 10C, green filter residues may remain in the second recesses RS2 that are formed by removing a portion of the third sub-color filter layer GL. A pigment removal process may be performed on the residue, and second sub-color filters CF2_2 may be formed to fill the second recesses RS2. The second sub-color filters CF2_2 may be directly formed on the protective dielectric layer 471.

The formation of the second sub-color filters CF2_2 may include employing a coating process in which the protective dielectric layer 471 is coated with a photoresist composition including a blue pigment or a red pigment, performing a soft bake process on the photoresist composition, performing an exposure process on the photoresist composition, and developing the photoresist composition to allow the photoresist composition to remain only in the second recesses RS2. The second sub-color filters CF2_2 may be constituted by the photoresist composition including the blue pigment or the red pigment.

Figure 11A:
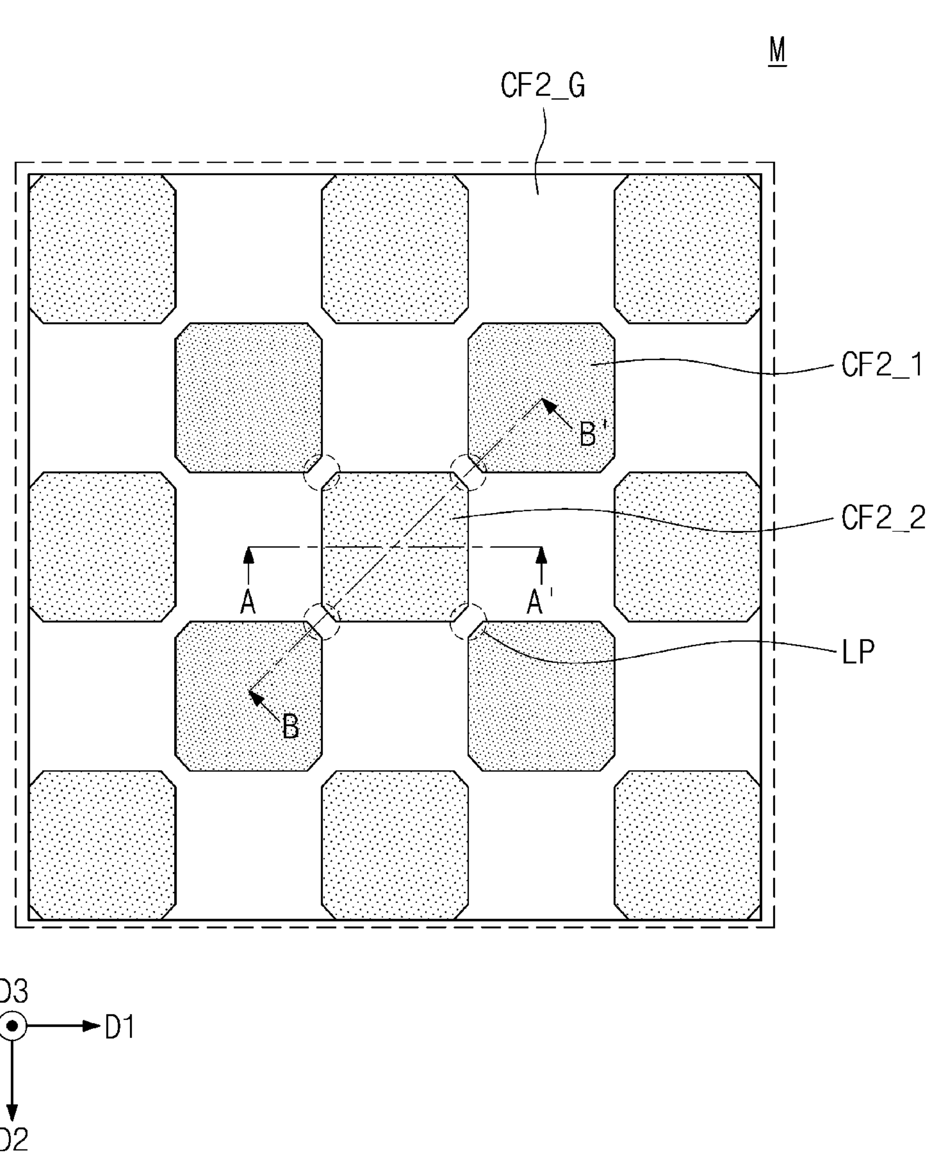
Figure 11B:
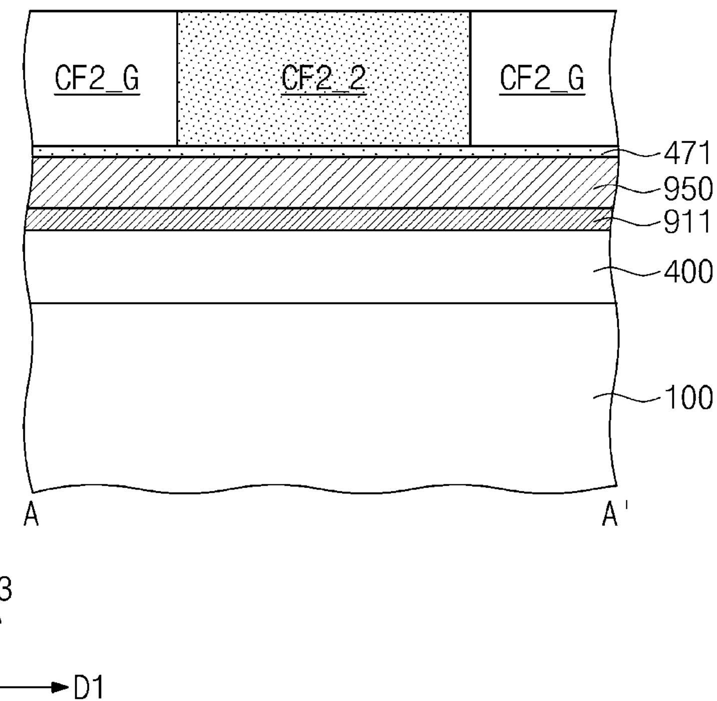
Figure 11C:
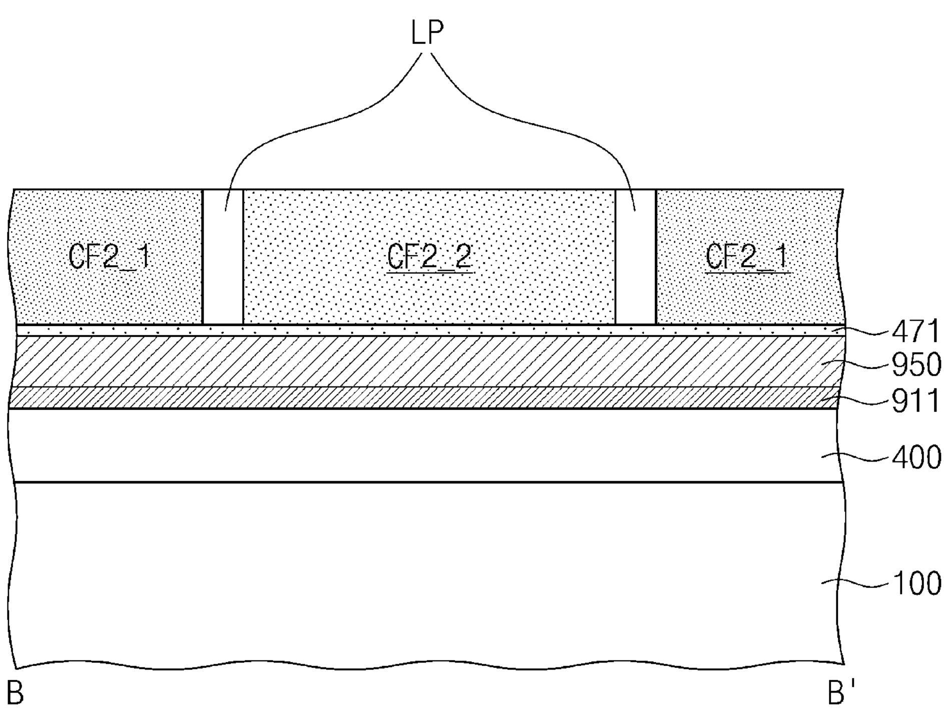

Referring to FIGS. 11A to 11C, first sub-color filters CF2_1 may be formed to fill the first recesses RS1. A residue of the red or blue pigment may remain in the first recesses RS1. A pigment removal process may be performed on the residue, and the first sub-color filters CF2_1 may be formed to fill the first recesses RS1. The first sub-color filters CF2_1 may be directly formed on the protective dielectric layer 471. The formation of the first sub-color filters CF2_1 may be substantially the same as the formation of the second sub-color filters CF2_2 discussed above.

Referring back to FIGS. 6, 7A, and 7B, a preliminary lens layer may be formed on the first, second, and third sub-color filters CF2_1, CF2_2, and CF2_G. The preliminary lens layer may directly cover top surfaces of the first, second, and third sub-color filters CF2_1, CF2_2, and CF2_G. The preliminary lens layer may be formed by a spin coating process that uses a transparent photoresist material or a transparent thermosetting resin. Lens mask patterns may be formed on the preliminary lens layer, and then the lens mask patterns may be used to perform an etching process. The etching process may form a microlens layer 500. Afterwards, a first coating layer LTO and a second coating layer ALO may be sequentially formed on the microlens layer 500. The first coating layer LTO may be formed by using plasma enhanced chemical vapor deposition (PECVD). The second coating layer ALO may be formed by atomic layer deposition (ALD). For example, the second coating layer ALO may be formed to have a thickness of about 50 Å to about 1,000 Å. The first and second coating layers LTO and ALO may include silicon oxide.

In an image sensor according to one or more embodiments, color filters may extend from a pixel array region to a line connection region of an optical black region, and it may thus be possible to prevent coating striation from occurring in the pixel array region.

In an image sensor according to one or more embodiments, a black photoresist may be used as a filtering layer on color filters on an optical black region, and it may be possible to prevent a flare phenomenon occurring due to arrangement of color filters in a Bayer pattern fashion.

Moreover, in an image sensor according to one or more embodiments, color filters on an optical black region and microlenses on the color filters may have their widths greater than that of each of a color filter and a microlens on a pixel array region, with the result that a lifting phenomenon may be prevented. The color filters on the optical black region may be strongly connected through a link pattern of a green filter, and it may thus be possible to prevent a lifting phenomenon of a blue or red filter.

In conclusion, one or more example embodiments of the present disclosure may improve performance, sensitivity, and reliability of the image sensor.

Although example embodiments have been described and illustrated in the accompanying drawings, it will be understood to those skilled in the art that various changes and modifications may be made without departing from the technical spirit and essential feature of the present disclosure. It will be apparent to those skilled in the art that various substitution, modifications, and changes may be thereto without departing from the scope and spirit of the present disclosure.

What is claimed is:

1. An image sensor comprising:

a substrate comprising a first surface, a second surface opposing the first surface, a pixel region and an optical black region, the optical black region comprising a dummy pixel region adjacent to the pixel region;

a first color filter on the pixel region and on the first surface, the first color filter comprising a first top surface and a first bottom surface opposing the first top surface;

a second color filter on the dummy pixel region and on the first surface, the second color filter comprising a second top surface and a second bottom surface opposing the second top surface;

a third color filter on the dummy pixel region and on the first surface, the third color filter comprising a third top surface and a third bottom surface opposing the third top surface; and a fence pattern between the first color filter and the second color filter, the fence pattern comprising a fourth top surface and a fourth bottom surface opposing the fourth top surface, wherein a first distance from the first surface to the first bottom surface in a first direction perpendicular to the first surface is shorter than a second distance from the first surface to the second bottom surface in the first direction, wherein a third distance from the first surface to the fourth top surface in the first direction is shorter than a fourth distance from the first surface to the second top surface in the first direction, wherein a first width of the first color filter in a second direction perpendicular to the first direction is less than a second width of the second color filter in the second direction and a third width of the third color filter in the second direction, wherein the third color filter is different from the second color filter, and wherein the first color filter and the second color filter are directly in contact with the fence pattern.

2. The image sensor of claim 1, wherein the dummy pixel region further comprises a light-shield layer between the first surface, the second color filter, and the third color filter.

3. The image sensor of claim 2, further comprising:

a first convex microlens vertically overlapping with the first color filter; and a second convex microlens vertically overlapping with the second color filter.

4. The image sensor of claim 2, wherein the pixel region further comprises a first color filter array including a first green filter, a first blue filter, and a red filter, and wherein the optical black region further comprises a second color filter array including a second blue filter and a second green filter.

5. The image sensor of claim 2, wherein the dummy pixel region further comprises a filtering layer on the second color filter and the third color filter, and wherein a first height of the filtering layer in the first direction is greater than a second height of the light-shield layer in the first direction.

6. The image sensor of claim 2, further comprising a fourth color filter on the optical black region and on the first surface, wherein a fourth width of the fourth color filter is in the second direction is greater than the second width of the second color filter in the second direction.

7. The image sensor of claim 2, wherein the second width of the second color filter is from 0.8 micrometers (μm) to 1.2 μm.

8. The image sensor of claim 2, wherein the pixel region further comprises a gate pattern extending into the substrate from the second surface.

9. The image sensor of claim 8, wherein the pixel region further comprises a first trench at least partially penetrating the substrate.

10. The image sensor of claim 9, wherein the optical black region further comprises a second trench at least partially penetrating the substrate.

11. An image sensor comprising:

a substrate comprising a first surface, a second surface opposing the first surface, a pixel region and an optical black region, the optical black region comprising a dummy pixel region adjacent to the pixel region;

a first color filter on the pixel region and on the first surface, the first color filter comprising a first top surface and a first bottom surface opposing the first top surface;

a second color filter on the dummy pixel region and on the first surface, the second color filter comprising a second top surface and a second bottom surface opposing the second top surface;

a third color filter on the dummy pixel region and on the first surface, the third color filter comprising a third top surface and a third bottom surface opposing the third top surface; and a fence pattern between the first color filter and the second color filter, wherein the fence pattern comprises a fourth top surface and a fourth bottom surface opposing the fourth top surface, wherein the second color filter is disposed on the fourth top surface, wherein a first distance from the first surface to the fourth bottom surface in a first direction perpendicular to the first surface is shorter than a second distance from the first surface to the second bottom surface in the first direction, wherein a first width of the first color filter in a second direction perpendicular to the first direction is less than a second width of the second color filter in the second direction and a third width of the third color filter in the second direction, and wherein the third color filter is different from the second color filter.

12. The image sensor of claim 11, wherein the dummy pixel region further comprises a light-shield layer between the first surface, the second color filter, and the third color filter.

13. The image sensor of claim 12, wherein the first distance in the first direction is shorter than a third distance from the first surface to a fifth bottom surface of the light-shield layer in the first direction.

14. The image sensor of claim 13, wherein the pixel region further comprises a first color filter array including a first green filter, a first blue filter, and a red filter, and wherein the optical black region further comprises a second color filter array including a second blue filter and a second green filter.

15. The image sensor of claim 14, wherein the second width of the second color filter is from 0.8 micrometers (μm) to 1.2 μm.

16. The image sensor of claim 14, wherein the first color filter and the second color filter are directly in contact with the fence pattern.

17. The image sensor of claim 16, further comprising:

a first convex microlens at least partially vertically overlapping with the first color filter; and a second convex microlens at least partially vertically overlapping with the second color filter.

18. The image sensor of claim 16, wherein the dummy pixel region further comprises a filtering layer on the second color filter and the third color filter, and wherein a first height of the filtering layer in the first direction is greater than a second height of the light-shield layer in the first direction.

19. The image sensor of claim 16, wherein the pixel region further comprises a first trench at least partially penetrating the substrate, and wherein the optical black region further comprises a second trench at least partially penetrating the substrate.

* * * * *